US006902972B2

(12) United States Patent
Tsau

(10) Patent No.: US 6,902,972 B2
(45) Date of Patent: Jun. 7, 2005

(54) HIGH-DENSITY METAL CAPACITOR USING DUAL-DAMASCENE COPPER INTERCONNECT

(75) Inventor: Liming Tsau, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/869,671

(22) Filed: Jun. 16, 2004

(65) Prior Publication Data

US 2004/0232520 A1 Nov. 25, 2004

Related U.S. Application Data

(63) Continuation of application No. 09/971,254, filed on Oct. 3, 2001.
(60) Provisional application No. 60/237,916, filed on Oct. 3, 2000.

(51) Int. Cl.[7] .......................................... H01L 21/8242
(52) U.S. Cl. ....................................... 438/253; 438/396
(58) Field of Search ................................ 438/253, 396, 438/FOR 220, FOR 430

(56) References Cited

U.S. PATENT DOCUMENTS

| 5,219,787 A | 6/1993 | Carey et al. |
| 5,406,447 A | 4/1995 | Miyazaki et al. |
| 5,693,563 A | 12/1997 | Teong |
| 5,705,849 A | 1/1998 | Zheng et al. |
| 5,739,579 A | 4/1998 | Chiang et al. |
| 5,946,567 A | 8/1999 | Weng et al. |
| 6,096,655 A | 8/2000 | Lee et al. |
| 6,107,204 A | 8/2000 | Yu et al. |
| 6,143,646 A | 11/2000 | Wetzel |
| 6,200,629 B1 * | 3/2001 | Sun .............................. 427/79 |
| 6,225,207 B1 | 5/2001 | Parikh |
| 6,235,579 B1 * | 5/2001 | Lou ........................... 438/253 |
| 6,255,217 B1 | 7/2001 | Angello et al. |

(Continued)

FOREIGN PATENT DOCUMENTS

| EP | 0 771 022 A2 | 5/1997 |
| EP | 0 954 016 A2 | 11/1999 |
| EP | 1 020 905 | 7/2000 |
| JP | 2000-208745 | 7/2000 |
| JP | 2001-36010 | 2/2001 |

OTHER PUBLICATIONS

"Integrated Capacitors and Resistors for Double Polysilicon Bipolar Transistors," *IBM Technical Disclosure Bulletin*, Apr. 1994, pp. 209–210, vol. 37, No. 04B, NB 9404209. (XP–002216301).

(Continued)

*Primary Examiner*—George Fourson
*Assistant Examiner*—Michelle Estrada
(74) *Attorney, Agent, or Firm*—Christie, Parker & Hale, LLP

(57) ABSTRACT

An electronic structure having a first conductive layer provided by a dual damascene fabrication process; an etch-stop layer provided by the fabrication process, and electrically coupled with the first conductive layer, the etch-stop layer having a preselected dielectric constant and a predetermined geometry; and a second conductive layer, electrically coupled with the etch-stop layer. The structure can be, for example, a metal-insulator-metal capacitor, an antifuse, and the like.

5 Claims, 21 Drawing Sheets

(4 of 21 Drawing Sheet(s) Filed in Color)

U.S. PATENT DOCUMENTS

| | | | |
|---|---|---|---|
| 6,281,541 B1 | | 8/2001 | Hu |
| 6,313,003 B1 | | 11/2001 | Chen |
| 6,320,244 B1 | * | 11/2001 | Alers et al. ............ 257/534 |
| 6,329,234 B1 | | 12/2001 | Ma et al. |
| 6,342,733 B1 | | 1/2002 | Hu et al. |
| 6,368,953 B1 | * | 4/2002 | Petrarca et al. ........... 438/625 |
| 6,384,468 B1 | | 5/2002 | Bernstein et al. |
| 6,413,815 B1 | | 7/2002 | Lai et al. |
| 6,417,537 B1 | | 7/2002 | Yang et al. |
| 6,441,419 B1 | | 8/2002 | Johnson et al. |
| 6,452,276 B1 | | 9/2002 | Cohen et al. |
| 6,455,370 B1 | * | 9/2002 | Lane ....................... 438/253 |
| 6,466,427 B1 | | 10/2002 | Chen |
| 6,498,364 B1 | | 12/2002 | Downey et al. |
| 6,589,839 B1 | * | 7/2003 | Basceri et al. ............ 438/254 |
| 6,593,655 B1 | * | 7/2003 | Loboda et al. ............ 257/760 |
| 2002/0072223 A1 | | 6/2002 | Gilbert et al. |

OTHER PUBLICATIONS

International Search Report for PCT/US01/31140 dated Oct. 24, 2002.

Written Opinion for PCT/US01/31140 dated Aug. 1, 2003.

* cited by examiner

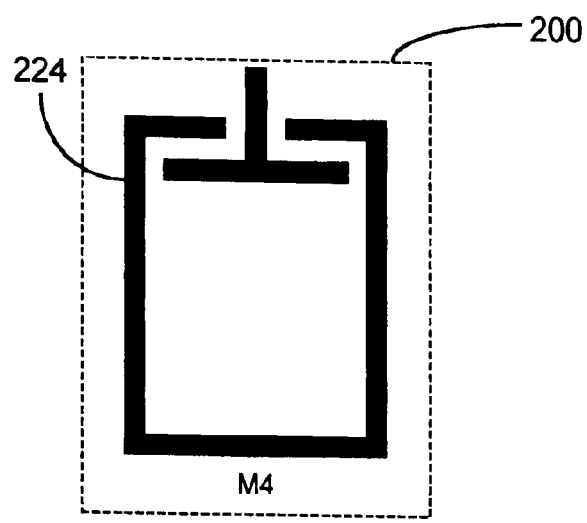
FIG. 2h
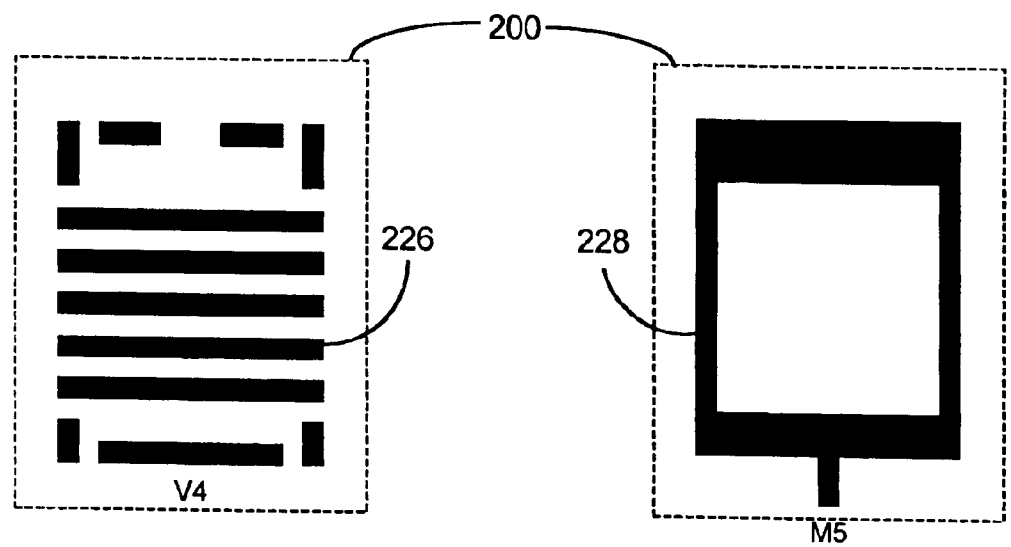
FIG. 2i
FIG. 2j

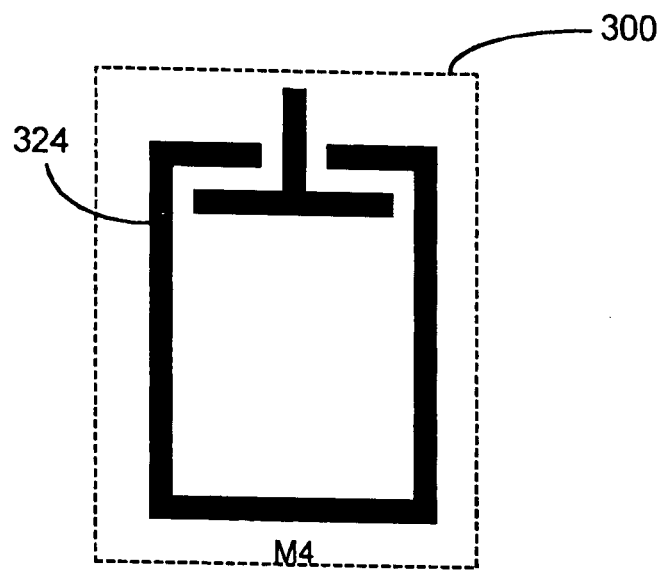
FIG. 3h
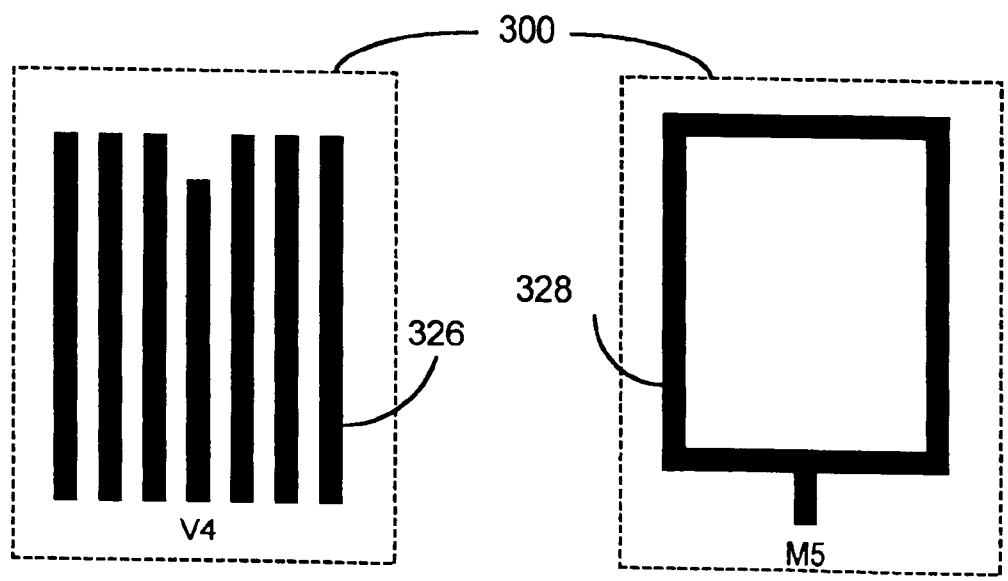
FIG. 3i  FIG. 3j

FIG. 4b   FIG. 4c

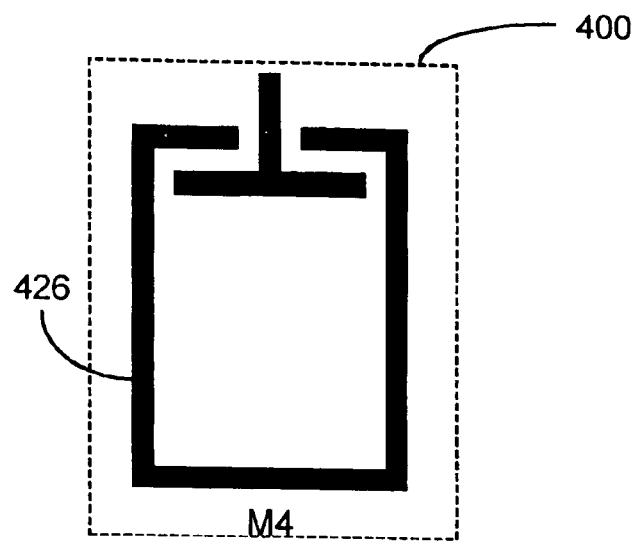
*FIG. 4h*
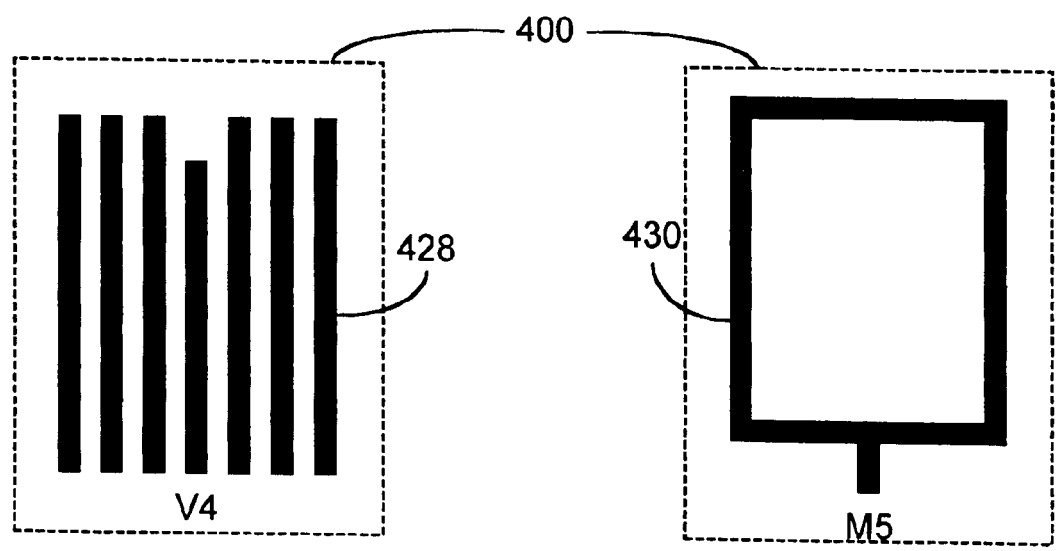
*FIG. 4i*          *FIG. 4j*

FIG. 5e     FIG. 5f

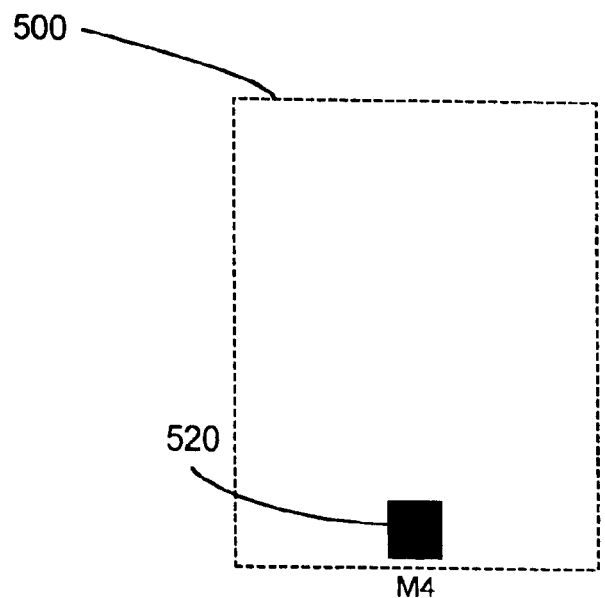
FIG. 5h
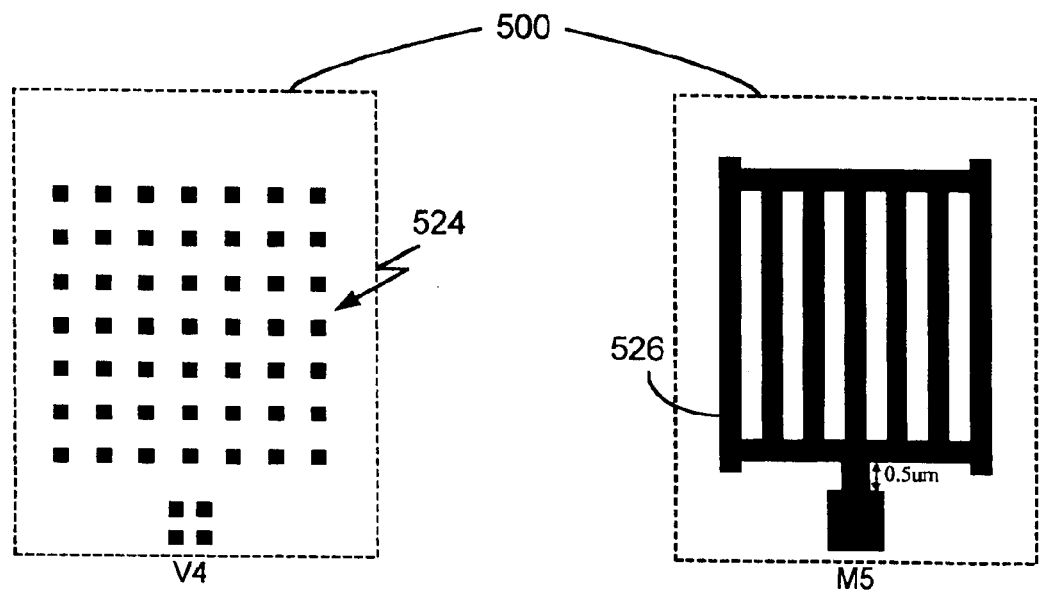
FIG. 5i  FIG. 5j

HIGH-DENSITY METAL CAPACITOR USING DUAL-DAMASCENE COPPER INTERCONNECT

CROSS-REFERENCE TO RELATED APPLICATION

This patent application is a continuation of U.S. patent application Ser. No. 09/971,254 filed Oct. 3, 2001 which claims the benefit of the filing date of U.S. Provisional Patent Application Ser. No. 60/237,916, filed Oct. 3, 2000.

BACKGROUND OF THE INVENTION

1. Field of the Invention

The invention herein relates to the formation of an integrated circuit including a capacitor. More specifically, this invention relates to the formation of a metal-insulator-metal capacitor in an integrated circuit.

2. Description of the Related Art

As integrated circuit (IC) complexity increases, the number of interconnections used in an IC increases accordingly. IC fabrication methods providing layouts multiple metal layer layouts have become popular techniques for accommodating increased number of interconnections in such ICs. Because highly-integrated ICs face difficulties meet the requisite yield and interconnect reliability requirements, newer methods and structures have been developed and applied in the semiconductor fabrication process. Two recently-developed fabrication techniques include the single damascene process and the dual damascene process. Single damascene is an interconnection fabrication process in which grooves are formed in an insulating layer and filled with metal, for example, copper, to form the conductive lines. Dual damascene is a multi-level interconnection process in which conductive via openings are formed in addition to forming the grooves of single damascene. Dual damascene is an improvement over single damascene because it permits the filling of both the conductive grooves and vias with metal at the same time, thereby eliminating process steps. Because a dual damascene structure satisfies the requirement of low resistance and high electromigration, it has been widely used in deep sub-micron VLSI fabrication processes for obtaining an efficient and reliable interconnections. In fabricating very and ultra large scale integration (VLSI and ULSI) circuits with the copper dual damascene process, insulating or dielectric materials are patterned with several thousand openings for the conductive lines and vias, which are filled at the same time with metal, and serve to interconnect the active and/or passive elements of the integrated circuit. However, dual damascene processes using copper metal fill can make device fabrication a daunting task. Copper is a known fast-diffuser and can act to "poison" a device, creating a failure, once it gets into the active area (i.e., source/drain/gate region of the transistor). This has required the development of new and advanced diffusion barriers to eliminate that threat, as well as different fab layouts to isolate the copper production part of the line from the rest of manufacturing. Metal-insulator-metal (MiM) capacitors are generally used in high-density integrated circuits in a variety of applications. For example, metal-electrode capacitors are widely used in mixed-signal/RF integrated circuits because of their better linearity and higher Q (due to lower electrode resistance) relative to other IC capacitor configurations. Metal-insulator-metal (MiM) capacitors have been commercially available in the standard CMOS mixed-signal process with aluminum interconnects, by adding a few additional steps to the traditional process flow. Present MiM fabrication techniques in dual damascene processes typically involve additional fabrication steps in which extra barrier and dielectric layers needed to form such devices tend to complicate an already difficult and expensive process. What is needed, then, is a MiM capacitor which can be reliably fabricated with fewer process steps using standard materials, preferably eliminating the additional fabrication steps typically associated with creating such devices.

SUMMARY OF THE INVENTION

The present invention solve the aforementioned limitations of the prior art by providing an electronic structure, having a first conductive layer provided by a predetermined fabrication process; an etch-stop layer provided by the predetermined fabrication process, the etch-stop layer electrically coupled with the first conductive layer, the etch-stop layer having a preselected dielectric constant and a predetermined geometry; and a second conductive layer, electrically coupled with the etch-stop layer. The preselected dielectric constant is preferred to be above about 4.0, or a relatively "high-k" dielectric value. The etch-stop layer is employed as the capacitor dielectric. The etch-stop layer can be a silicon nitride having a preselected dielectric constant of between about 5.5 and about 9.0. Also, the predetermined fabrication process is desired to be a dual damascene fabrication process, such as a via-first dual damascene process, where at least one of the first and second conductive layers comprises a metal. The electronic structure of the present invention is described for convenience in terms of a metal-insulator-metal capacitor, but the principles herein also can be employed to fabricate a multiplicity of conductor/dielectric structures, including, for example, an antifuse. Furthermore, the structure can be formed from horizontally- and vertically-disposed regions to create the desired aggregate capacitance or other desired electrical characteristics.

The semiconductor device of the present invention employs existing fabrication processes, and in particular the existing etch stop layers, to fabricate the desired devices and structures, thereby minimizing cost and increasing the relative density of desired physical and electrical characteristics. Such a device can include a dielectric matrix with a dielectric constant having a first dielectric value, for example of a low-k (k<about 4.0) dielectric. Selectively disposed within the dielectric matrix are conductive regions, such as metals or organic conductors, each of the conductive regions having a predetermined shape, and being set apart in at least one of a horizontal direction and a vertical direction, relative to others of the conductive regions. Selected ones of the conductive regions are conductively intercoupled using interconnected metal/via layers. The device also includes etch stop regions selectively disposed within the dielectric matrix. Each of the conductive regions have a predetermined shape, and are set apart in at least one of a horizontal direction and a vertical direction relative to others of the conductive and etch stop regions. Selected ones of the etch stop regions are interposed between respective conductive regions. The etch stop regions have dielectric constants having a second dielectric value, which are effectively greater than the first dielectric values, for example k>5.0. Selected others of the conductive regions, separated by selected ones of the etch stop regions, are capacitively intercoupled by the selected etch stop regions. A first electrode is electrically coupled with a predetermined one of the selected conductively intercoupled conductive regions; and a second electrode is electrically coupled with a predetermined one of the selected others of the conductive regions, separated by selected ones of the etch stop regions, and capacitively intercoupled by the selected etch stop regions. Such a semiconductor device can be readily adapted to a metal-insulator-metal capacitor, and antifuse, or a multiplicity of other conductor/dielectric components and devices.

BRIEF DESCRIPTION OF THE DRAWINGS

The patent or application file contains at least one drawing executed in color. Copies of this patent application publication with color drawing(s) will be provided by the Office upon request and payment of the necessary fee.

These and other features, aspects and advantages of the present invention will be more fully understood when considered with respect to the following detailed description, appended claims and accompanying drawings, wherein:

FIG. 2b is a plan illustration of the metal layer #1 (M1) of the capacitor in FIG. 2a;

FIG. 2c is a plan illustration of the via layer #1 (V1) of the capacitor in FIG. 2a;

FIG. 2d is a plan illustration of the metal layer #2 (M2) of the capacitor in FIG. 2a;

FIG. 2e is a plan illustration of the via layer #2 (V2) of the capacitor in FIG. 2a;

FIG. 2f is a plan illustration of the metal layer #3 (M3) of the capacitor in FIG. 2a;

FIG. 2g is a plan illustration of the via layer #1 (V3) of the capacitor in FIG. 2a;

FIG. 2h is a plan illustration of the metal layer #4 (M4) of the capacitor in FIG. 2a;

FIG. 2i is a plan illustration of the via layer #4 (V4) of the capacitor in FIG. 2a;

FIG. 2j is a plan illustration of the metal layer #5 (M5) of the capacitor in FIG. 2a;

FIG. 3b is a plan illustration of the metal layer #1 (M1) of the capacitor in FIG. 3a;

FIG. 3c is a plan illustration of the via layer #1 (V1) of the capacitor in FIG. 3a;

FIG. 3d is a plan illustration of the metal layer #2 (M2) of the capacitor in FIG. 3a;

FIG. 3e is a plan illustration of the via layer #2 (V2) of the capacitor in FIG. 3a;

FIG. 3f is a plan illustration of the metal layer #3 (M3) of the capacitor in FIG. 3a;

FIG. 3g is a plan illustration of the via layer #1 (V3) of the capacitor in FIG. 3a;

FIG. 3h is a plan illustration of the metal layer #4 (M4) of the capacitor in FIG. 3a;

FIG. 3i is a plan illustration of the via layer #4 (V4) of the capacitor in FIG. 3a;

FIG. 3j is a plan illustration of the metal layer #5 (M5) of the capacitor in FIG. 3a;

FIG. 4b is a plan illustration of the metal layer #1 (M1) of the capacitor in FIG. 4a;

FIG. 4c is a plan illustration of the via layer #1 (V1) of the capacitor in FIG. 4a;

FIG. 4d is a plan illustration of the metal layer #2 (M2) of the capacitor in FIG. 4a;

FIG. 4e is a plan illustration of the via layer #2 (V2) of the capacitor in FIG. 4a;

FIG. 4f is a plan illustration of the metal layer #3 (M3) of the capacitor in FIG. 4a;

FIG. 4g is a plan illustration of the via layer #1 (V3) of the capacitor in FIG. 4a;

FIG. 4h is a plan illustration of the metal layer #4 (M4) of the capacitor in FIG. 4a;

FIG. 4i is a plan illustration of the via layer #4 (V4) of the capacitor in FIG. 4a;

FIG. 4j is a plan illustration of the metal layer #5 (M5) of the capacitor in FIG. 4a;

FIG. 5b is a plan illustration of the metal layer #1 (M1) of the capacitor in FIG. 5a;

FIG. 5c is a plan illustration of the via layer #1 (V1) of the capacitor in FIG. 5a;

FIG. 5d is a plan illustration of the metal layer #2 (M2) of the capacitor in FIG. 5a;

FIG. 5e is a plan illustration of the via layer #2 (V2) of the capacitor in FIG. 5a;

FIG. 5f is a plan illustration of the metal layer #3 (M3) of the capacitor in FIG. 5a;

FIG. 5g is a plan illustration of the via layer #1 (V3) of the capacitor in FIG. 5a;

FIG. 5h is a plan illustration of the metal layer #4 (M4) of the capacitor in FIG. 5a;

FIG. 5i is a plan illustration of the via layer #4 (V4) of the capacitor in FIG. 5a; and FIG. 5j is a plan illustration of the metal layer #5 (M5) of the capacitor in FIG. 5a.

DETAILED DESCRIPTION OF THE EMBODIMENTS

Figure 1A:
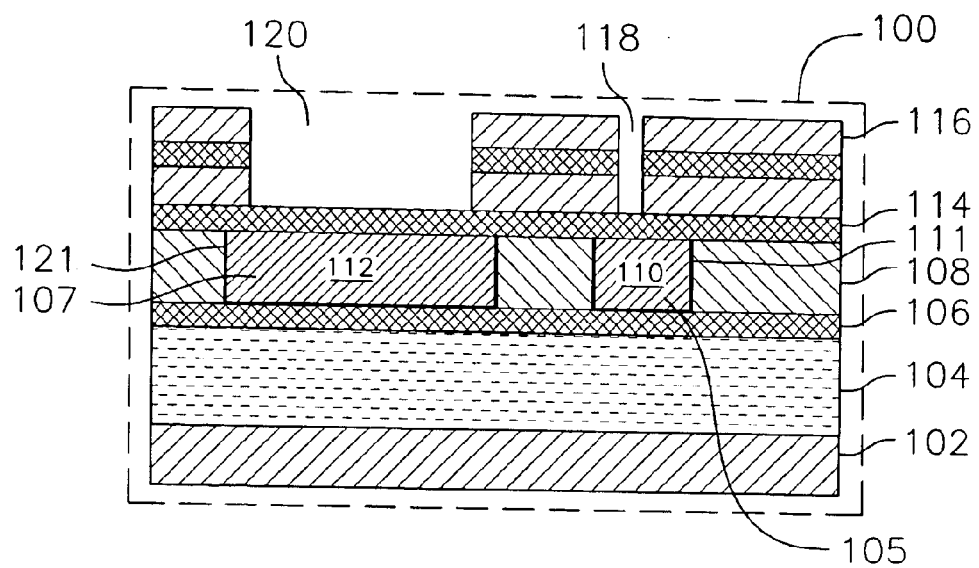
FIG. 1a is a partially-fabricated embodiment of a semiconductor device according to the present invention after the formation of vias.

Devices, including capacitors, according to the present invention are intended to be easily and inexpensively implemented in copper dual-damascene processes, using existing process steps. The capacitors are fully CMOS logic process compatible, and are amenable to deep-submicron (<0.13 µm) processing. Although the present invention is described in the context of metal-insulator-metal capacitors, the teachings of the invention herein also can include other conductor/dielectric devices, including, without limitation, anti-fuse devices. Further, other conductive materials, including for example, conductive polymers may be used in addition to metals.

Damascene process refers to a fabrication process sequence in which a pattern of interconnects is first etched into an interlevel dielectric layer such as, for example, silicon dioxide. This dielectric layer may be deposited on a barrier layer used to prevent the metal from diffusing into the silicon substrate. A thin "seed" layer is then used for depositing the metal in the etched pattern to create the interconnects. Finally, the surface is polished back even with the surface, typically by chemical mechanical polishing (CMP). Dual damascene is a variation whereby intersecting troughs in the same interlevel dielectric are sequentially etched and concurrently backfilled with a metal stack. The trough overfill is then polished back to a planar surface, leaving an inlaid metal trace. The dual damascene process can be used for forming the multilevel conductive lines of metal, such as copper, in the insulating layers of multi-layer substrates on which semiconductor devices are mounted. The term "dual" refers to the formation of a second channel, a via 5000 to 7000 Å deep, within the trench. Existing dual damascene processes utilize silicon dioxide as the insulator between the substrate and the conductive path, as well as between conductive paths. Also, the conventional dual damascene process uses silicon nitride as an etch stop to prevent distortion of the via size during the final etch step. The final etch step is generally used to create the via, as well as the interconnection trench, prior to filling the via and interconnection with a conductive material. The use of silicon nitride as an etch stop and a conventional photo-resist to define the trench in the second insulative layer can provide for very high selectivity for the etch process.

Several different dual-damascene approaches have been investigated, for example, the via-first technique, the trench-first and the buried-via technique, a self-aligned process. For the purposes of illustration, MiM capacitors according to the present invention are described in the context of the via-first copper dual damascene approach, although those skilled in the art will recognize that the invention is not so limited, but may be realized using other metals and other damascene techniques, in light of the teachings herein.

FIGS. 1a–1i illustrate semiconductor device 100 in the form of a capacitor, in particular, a conductor-insulator-conductor capacitor, according to the present invention. Although the invention herein is implemented as a metal-insulator-metal (MiM) capacitor in a dual damascene fabrication process, the principles of using an etch stop layer as the insulation layer in a conductor-insulator-conductor capacitor can be implemented in other processes as well, including, for example, single damascene and subtractive etch processes. A dual-damascene process can provide savings relative to single damascene processes because only one metal fill step and one chemical mechanical polishing step are required for each level of conductor, and the wiring level and interlevel connections are created with a single polishing step. Numerous dual-damascene process schemes exist but, overall, these schemes may be classified into "via first" or "trench first," depending upon which pattern, via or trench, is initially delineated. Although described herein in the context of a via-first scheme, it will be understood that the present invention also can be realized using a trench-first scheme.

In the via-first sequence, the via is masked and etched through the two layers of dielectric. The photomasking process for the subsequent trench etch must expose and cleanly develop a trench pattern in resist that has flooded the deep via. Typically, the via is covered by a photoresist or organic plug that protects the via and the underlying via nitride. Then the trench mask is aligned with the via hole and etched through the top layer of dielectric stopping on the first nitride layer. Finally, the nitride is etched at the bottom of the via to expose the underlying copper line. In the standard dual damascene process, the insulating layer is coated with a photoresist which is exposed through a first mask with image pattern of the via openings and the pattern is anisotropically etched in the upper half of the insulating layer. The photoresist now is exposed through a second mask with an image pattern of the conductive line openings, after being aligned with the first mask pattern to encompass the via openings. In anisotropically etching the openings for the conductive lines in the upper half of the insulating material, the via openings already present in the upper half are simultaneously etched and replicated in the lower half of the insulating material. After the etching is complete, both the vias and line openings are filled with metal. Then, the surface of the metal layer is planarized, preferably using chemical-mechanical polishing process, although etch-back and capping methods also suitable for planarization.

It is desirable that a "hard mask" etch barrier film, fabricated of for example, silicon dioxide or silicon nitride, be used to prevent the upper trench patterns of dual damascene from being etched through, particularly if the layer underlying the insulation layer is the device contact or via area. Other barrier films may be used, however silicon nitride is preferred because silicon nitride, having a dielectric constant of about 7.0, allows a selective etch process with respect to different underlying materials. Spin-on-glass, plasma nitride are also suitable as etch stop materials, for example, when polyimide layers are used. The silicon nitride etch stop barrier can be deposited using, for example, Plasma Enhanced Chemical Vapor Deposition (PECVD) such that it has a thickness between about 10 to 2000 angstroms.

Thus, in the dual-damascene process, there usually is a dielectric layer deposited on top of a metal layer, which acts as an etch-stop layer for a via etch. Typically, this dielectric layer is removed during a subsequent metal trench etch. However, if the design is varied such that a via layer is drawn without having a metal layer on top of it, the etch-stopping layer can be used as a field dielectric between the bottom metal and the via layer, to form a metal-insulator-metal (MiM) capacitor.

In a via-first dual-damascene process, the via is masked and etched through two layers of dielectric using a high-aspect ratio (HAR) etch, stopping at a hard mask or etch stop layer which lies beneath the via. Then, a trench pattern is aligned with the via hole, and a trench is etched into the dielectric surrounding the via hole. Finally, the etch stop layer is removed, and the conductor material is deposited in the via and trench and is substantially planarized and polished. Dual-damascene processes can present significant fabrication challenges. Therefore, to contain product costs, it is desirable to minimize the addition of processing steps during device manufacturing. Prior art metal-insulator-metal capacitors (MiM), particularly those fabricated using dual-damascene process, often require additional processing steps, including HAR etches, vertical wall definition and deposition, and the like, which can lead to greatly reduced product yields and substantial cost. In prior art dual damascene processes, the etch stop layer may be considered to be a hindrance to MiM fabrication. According to the present invention, a hard mask or etch stop layer, deposited by standard deposition techniques, can be employed as the insulator in a capacitor-like structure, including capacitors and antifuses.

In FIGS. 1a–1i, a cross-sectional model of an embodiment of the present invention is described during the fabrication of a five-layer metal device 100, where like numbers are representative of like structures, regions, and components. In FIG. 1a, a conductive barrier is formed upon substrate 102 of semiconductor device 100, using dielectric layer 104 and dielectric diffusion barrier 106. The conductive barrier prevents conductor (metal) ions from invading substrate 102, disadvantageously altering its electrical properties. Next, interlayer dielectric layer #1 (ILD1) 108 is deposited upon barrier layer 106 using, for example, chemical vapor deposition (CVD), physical vapor deposition (PVD), and electrochemical vapor deposition (EVD) techniques. ILD1 (and subsequently-deposited ILD layers) can be manufactured of low-k (k<about 5.0) materials, such as silicate-based ILDs including, for example, fluorinated (SiOF-FSG), carbon-doped (SiOC2-CSG), hydrogen-doped (HSG), and undoped (SiO2-USG) silicon dioxide glass, and combinations thereof, as well as organic polymer-based ILDs such as SiLK, from Dow Chemical (Midland, Mich.), and FLARE and HOSP from Honeywell Corp., Sunnyvale, Calif., and combinations.

Wells 105, 107 are etched into ILD1 108, stopping the etch back at layer 109, using standard photolithography and etching processes. To prevent copper contamination of ILD1 108, metal barrier layer 111 is deposited within the via well 105, and metal barrier layer 121 is deposited within the core well 107. Suitable diffusion barrier metals can include, for example, Ta/TaN. With wells 105, 107 thus formed, the voids of wells 105, 107 are completely filled with metal (M1 layer), as is represented by conductor plugs 110, 112. The conductor material of layer M1 (as well as subsequent via and metal layers) can be, for example, Al, Cu, W, Ti, TiN, or silicides, with Cu frequently being used in the popular Cu dual damascene process. In general, the M1 layer, and in particular, plugs 110, 112 serve as the lower electrical contact for device 100.

After the formation of the M1 layer, the surface overburden of device 100 is removed using, for example, chemical mechanical polishing (CMP), or selective reactive ion etching (sRIE). Next, etch stop layer #1 (ES1) 114 is deposited upon ILD1 layer 108 and conductor plugs 110, 112. ES1 can be composed of SiN, SiC, phosphosilicate glass (PSG), and the like. It is desirable that the etch stop material of ES1, and subsequent etch stop layers, possess a higher dielectric constant (k) than the ILD layers. Indeed, it is advantageous to employ low-k materials (e.g., k<about 5.0) for ILD, and to employ materials possessing a higher k (>about 5.0) for etch stop layers. For example, silicon nitride can have a dielectric constant of between about k=5.5 to about k=9.0, and generally about k=7.0, depending upon layer fabrication methods, etc.

Continuing in FIG 1a, interlayer dielectric layer #2 (ILD2) 116 is then formed upon ES1 114, with etch stop layer #2 (ES2) 119 being suitably disposed therein. ES2 also can be composed of SiN, SiC, phosphosilicate glass (PSG), and the like, as is ES1. ILD2 116 is desired to possess a lower dielectric constant than, and practical differential etch characteristics relative to, ES1 114 and ES2 119. Patterns (not shown) are then formed on the surface of ILD2 116, with via well 118 and core well 120 being etched into ILD2 116, through ES2 119, and stopping at ES1 114.

Although conductor plugs 110, 112 are shown as being separate entities, the M1 layer also can be formed as a contiguous conductive layer, for example, as a monolithic layer over an entire wafer, or a unitary layer with respect to one or more devices, depending upon the device design. Additional exemplary embodiments of M1 configurations are illustrated in FIGS. 2b, 3b, 4b, and 5b. In certain embodiments of the present invention, plugs 110, 112 form the lower-most electrode of the capacitor, or antifuse, formed thereby. In particular embodiments, it may desirable to form the lowermost electrode with set apart portions, spatially arranged in a predetermined relationship, in order to gain the advantage of the additional capacitance inherent in the portion of the dielectric layer disposed between the set-apart portions of the electrode. Such an arrangement is exemplified in FIG. 1a, where a portion of interlayer dielectric layer #1 (ILD1) 108 is disposed between plugs 110, 112. Thus far, device 100 in FIG. 1a has been prepared using an exemplary via-first dual damascene process.

Figure 1B:
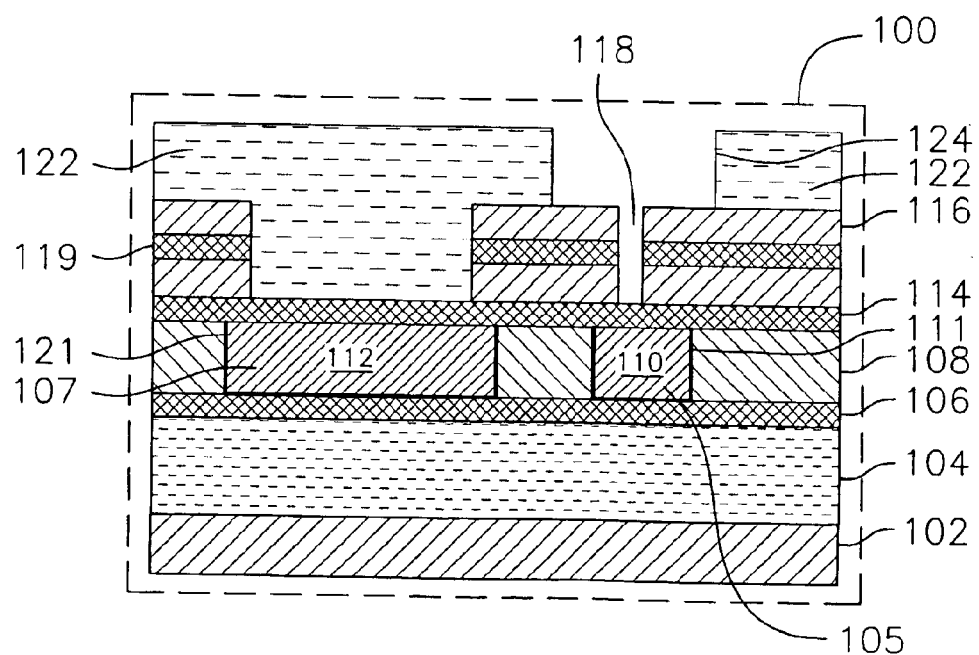
FIG. 1b is a partially-fabricated embodiment of the semiconductor device in FIG. 1a, after the addition of a trench-patterned photoresist layer.

In FIG. 1b, preparation is made to create a first trench contiguous with via well 118. To that end, photoresist layer 122 is deposited upon ILD2 116, with trench pattern 124 therein being aligned to, and in communication with, first via well 118. In prior art, dual damascene processes, including those forming MiM capacitors, all wells in the interlevel dielectric typically have trench patterns respectively aligned thereto, including core well 120, allowing the etch stop layer directly inferior to the well to be removed. In the method of the present invention, however, photoresist layer 122 is caused to substantially fill core well 120, such that the portion of ES2 114, which is directly inferior thereto, is shielded from the subsequent etch step.

Figure 1C:
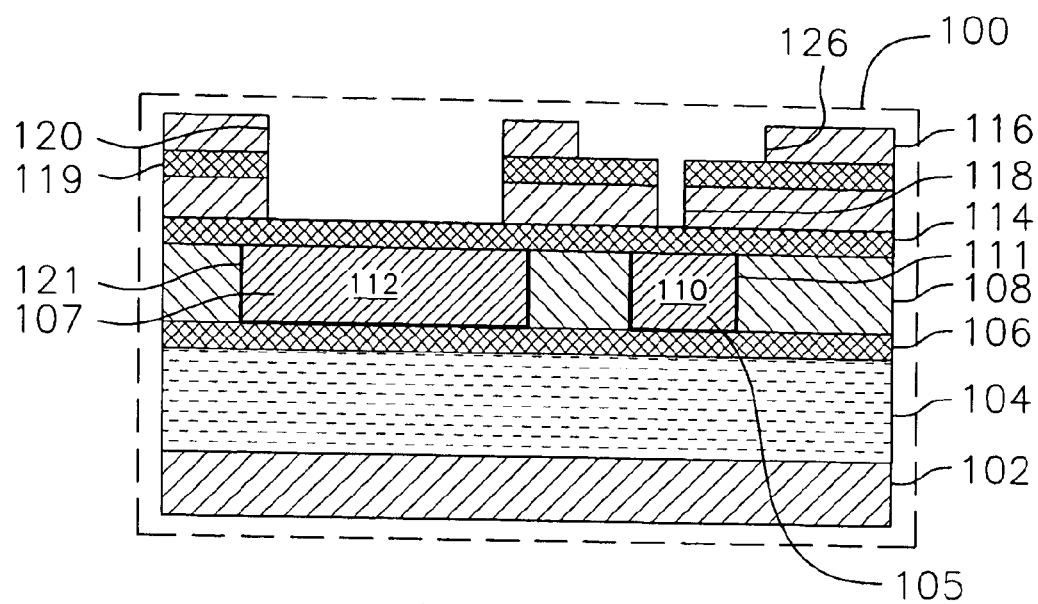
FIG. 1c is a partially-fabricated embodiment of the semiconductor device in FIG. 1b, after trench formation.

FIG. 1c illustrates device 100 subsequent to etching, and after photoresist layer 122, seen in FIG. 1b, has been stripped away. During this partial etch step, trench well 126 is formed superior and adjacent to first via well 118, by etching back ILD2 116 until ES2 119 is reached. Subsequently, exposed ES1 114 within first well 118 is etched back, such that well 118 communicates with the M1 layer via plug 110. The region of ES1 114 inferior to capacitor well 120 remains substantially intact, due to the protective effect of photoresist layer 122 during the etch process.

Figure 1D:
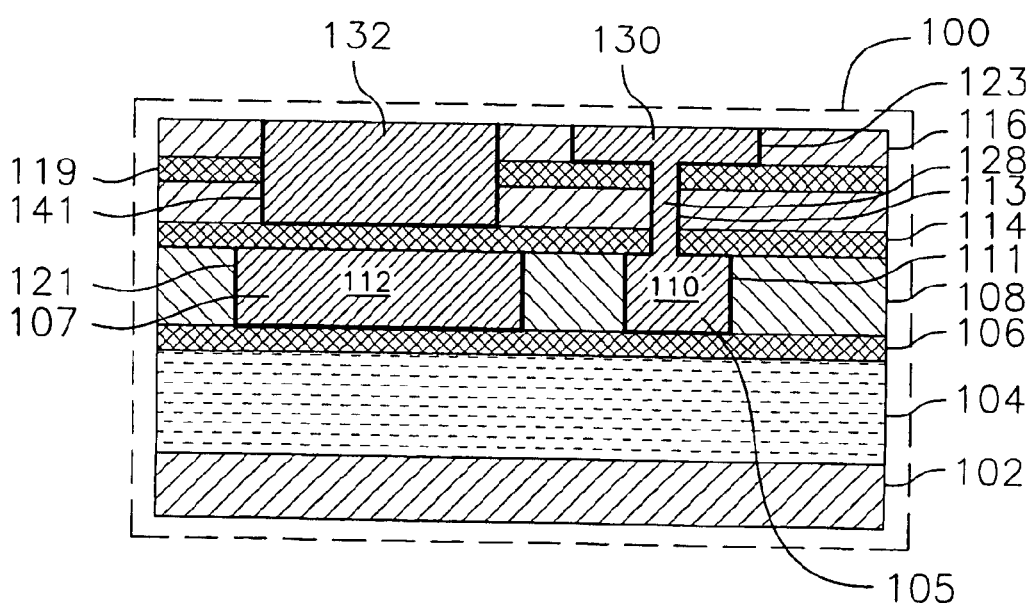
FIG. 1d is a partially-fabricated embodiment of the semiconductor device in FIG. 1c, after metal layer #2 deposition.

In FIG. 1d, device 100 is illustrated after the deposition of a second conductor (metal-M2) layer. In preparation for M2 deposition, thin layers of barrier metal 113, 123, 141 are deposited upon walls of via well 118, trench well 126, and capacitor core well 120, respectively. Then, wells 118, 120, 126 are completely filled with conductor metal, forming V1 via 128, M2 trench plug 130, and M2 capacitor plug 132. Using the dual damascene process, layers V1 and M2 are effectively deposited in the same backfilling step. After the formation of the V1/M2 layer, the surface overburden of device 100 again is removed using, for example, chemical mechanical polishing (CMP), or selective reactive ion etching (sRIE). A skilled practitioner would realize that FIG. 1d illustrates the basic components of a conductor-insulator-conductor capacitor in the form of conductor plug 112, etch stop layer 114, and conductor plug 132, respectively. In FIG.

1d, the spatial relationships between 110 and 112 can be selected to provide additional capacitance using the inherent capacitive characteristics of ILD1 108. Thus, conductive regions 110, 112, 128, and 130 can form the lower plate capacitor, conductive region 132 the upper plate, and ES1 114 can be the primary capacitor dielectric. A skilled artisan also would realize that by selecting the geometries of, and the spatial relationships between, components 110, 112, 130 and 132, the total capacitance of device 100 can further be adjusted or "tuned," using the inherent capacitive characteristics of ILD1 108, and ILD2 116.

Figure 1E:
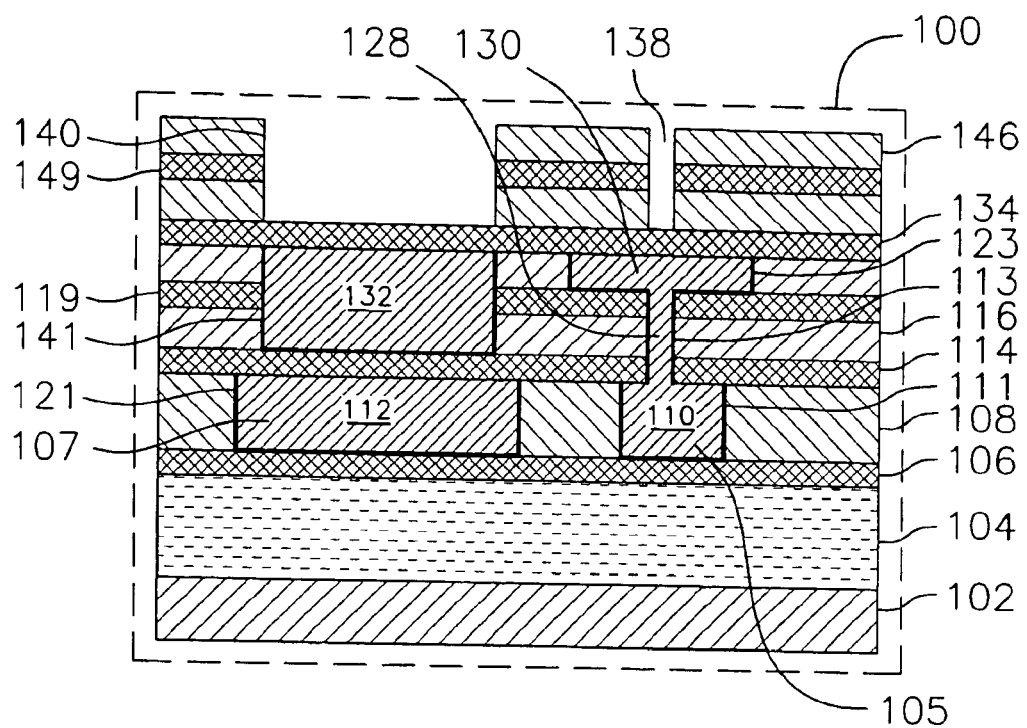
FIG. 1e is a partially-fabricated embodiment of the semiconductor device in FIG. 1d, after the addition of an etch-stop interposed interlayer dielectric which is provided with vias.

FIG. 1e shows device 100 after formation of second via well 138 and capacitor conductor well 140. Following deposition and planarization/polishing of the V1/M2 layer, etch stop layer #3 (ES3) 134 is deposited thereupon. In addition, Interlayer dielectric layer #4 (ILD4) 146 is deposited, with etch stop layer #4 (ES4) 149 being disposed therein. The surface of device 100 then is patterned (not shown) to permit the formation of via well 138 and conductor well 140 during an etching process, which penetrates though ES4 149 but which leaves ES3 134 essentially intact.

Figure 1F:
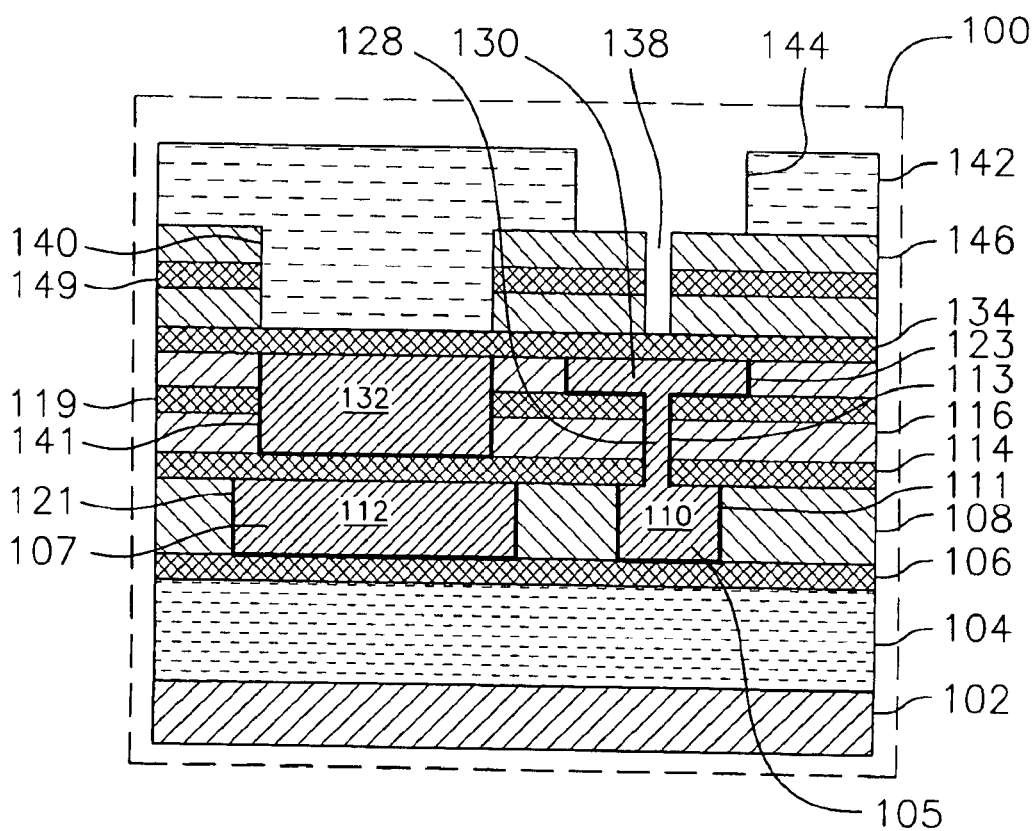
FIG. 1f is a partially-fabricated embodiment of the semiconductor device in FIG. 1e, after the addition of a trench-patterned photoresist layer.

In FIG. 1f, photoresist layer 142, similar to layer 122 in FIG. 1b, is applied to the surface of device 100, preferably filling well 140 to protect the portion of ES3 134 disposed thereunder, and providing trench pattern 144 which is aligned to, and in communication with, via well 138.

Figure 1G:
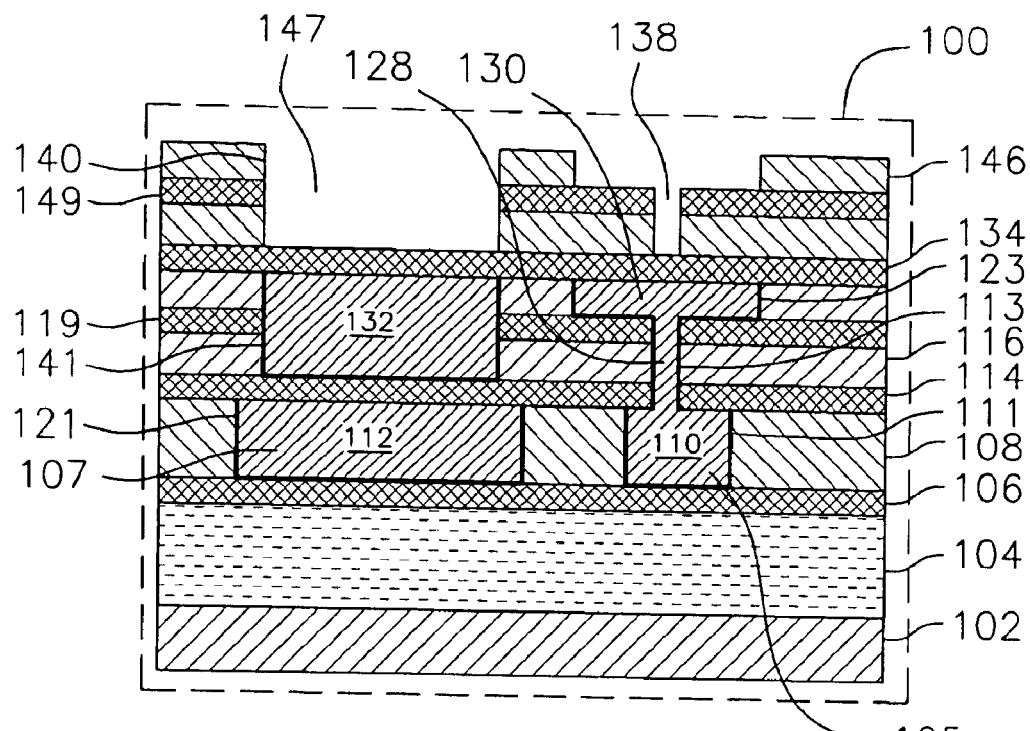
FIG. 1g is a partially-fabricated embodiment of the semiconductor device in FIG. 1f, after trench formation.

FIG. 1g illustrates device 100 subsequent to etching, and after photoresist layer 142, seen in FIG. 1f, has been stripped away. This is similar to the state of device 100 in FIG. 1c, after trench 126 has been formed and photoresist layer 122 stripped away. During this partial etch step, trench well 146 is formed superior and adjacent to via well 138, by etching back ILD4 136 until ES3 134 is reached. Subsequently, exposed ES3 134 within first well 138 is etched back, such that well 138 communicates with the M2 layer via plug 130. The region of ES3 134 inferior to capacitor well 140 remains substantially intact, due to the protective effect of photoresist layer 142 during the etch process.

Figure 1H:
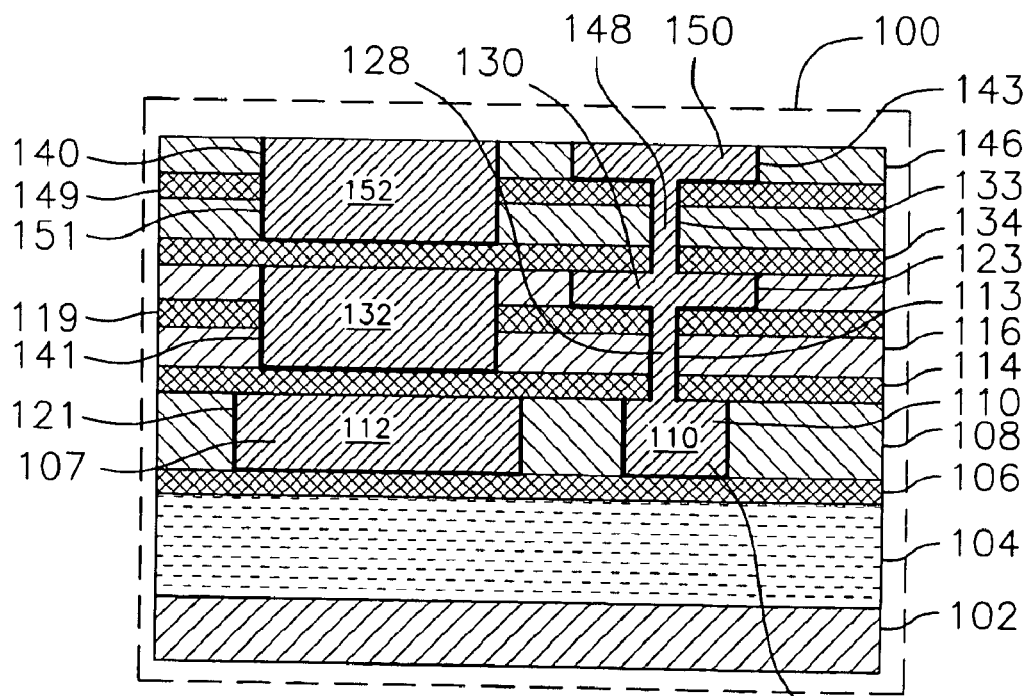
FIG. 1h is a partially-fabricated embodiment of the semiconductor device in FIG. 1g, after metal layer #3 deposition.

In FIG. 1h, device 100 is illustrated after the deposition of a third conductor (metal-M3) layer. In preparation for M3 deposition, thin layers of barrier metal 133, 143, 151 are deposited upon walls of via well 138, trench well 146, and capacitor core well 140, respectively. Then, wells 138, 140, 146 are completely filled with conductor metal, forming V2 via 148, M3 trench plug 150, and M3 capacitor plug 152. Using the dual damascene process, layers V2 and M3 are effectively deposited in the same backfilling step. After the formation of the V2/M3 layer, the surface overburden of device 100 again is removed using, for example, chemical mechanical polishing (CMP), or selective reactive ion etching (sRIE).

Figure 1I:
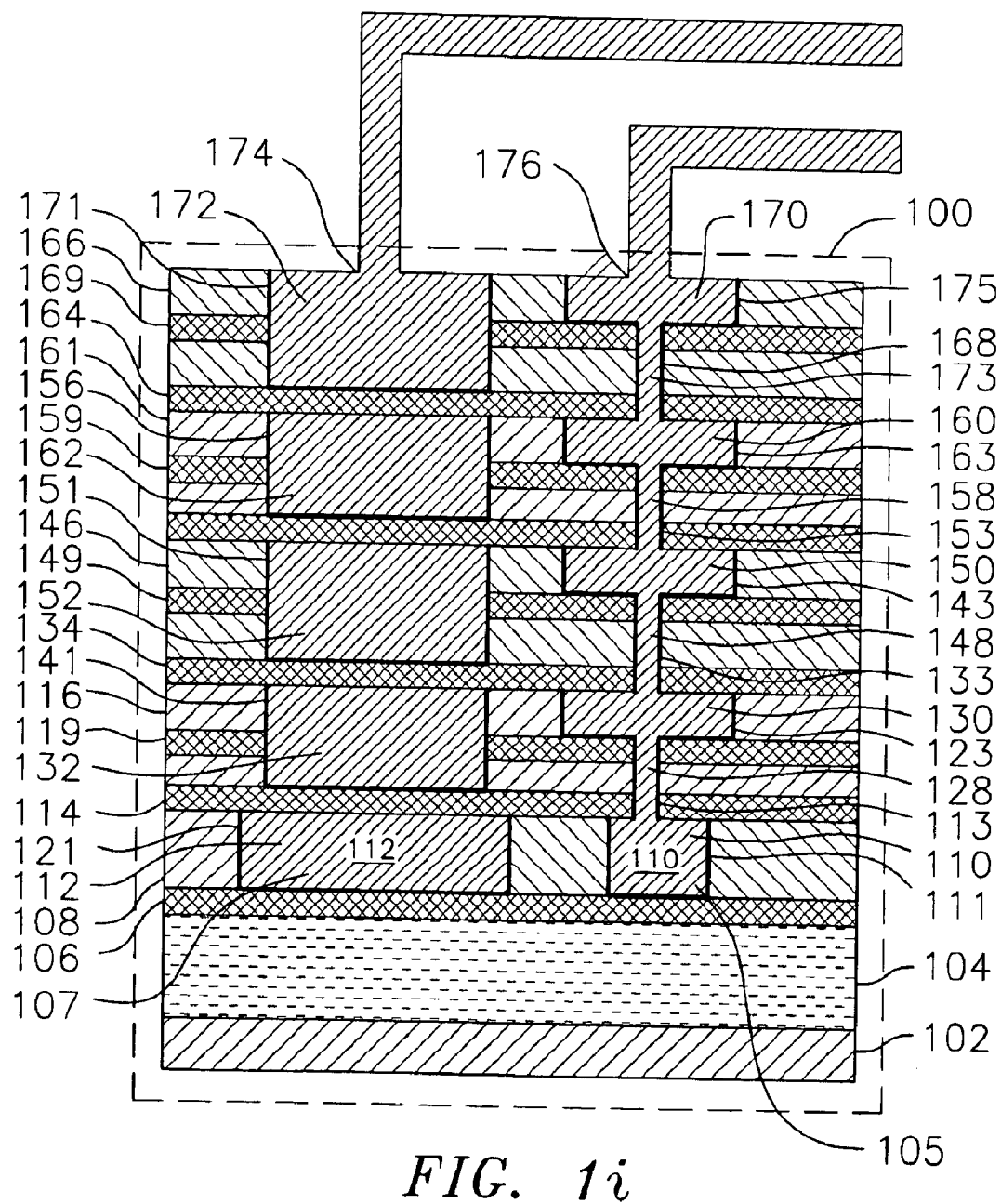
FIG. 1i is a fully-fabricated embodiment of the semiconductor device in FIG. 1h, after the deposition of metal layers #4 and #5.

In FIG. 1i, device 100 is illustrated after 4th and 5th conductor layers, metal M4 and M5, respectively, are deposited. Using processes similar to those described with respect to FIGS. 1a–1h, ES5 154 and ILD5 156, having ES6 159 disposed therein, are deposited and then etched back to permit deposition of M4 capacitor plug 162, V3 via 158, and M4 trench 160. Also, layers ES7 164 and ILD6 166, having ES8 169 disposed therein, are deposited and then etched back to permit deposition of M5 capacitor plug 172, 43 via 168, and M5 trench 170. Finally, inner (upper) capacitor lead 174 and outer (lower) capacitor lead 176 are electrically connected with plug 172 and plug 170, respectively.

Figure 2A:
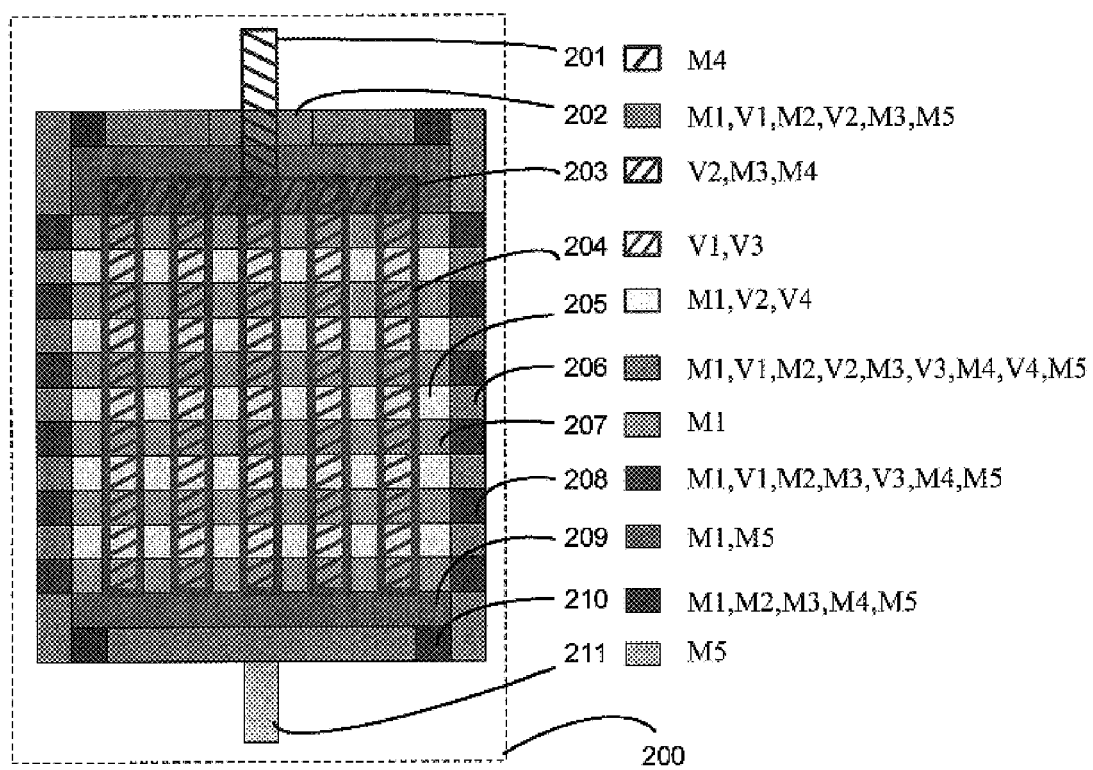
FIG. 2a is a color representation of a composite plan view of one embodiment of an multi-layer interdigitated MiM capacitor, including a color-coded key describing selected layers of preselected regions.
Figure 2D:
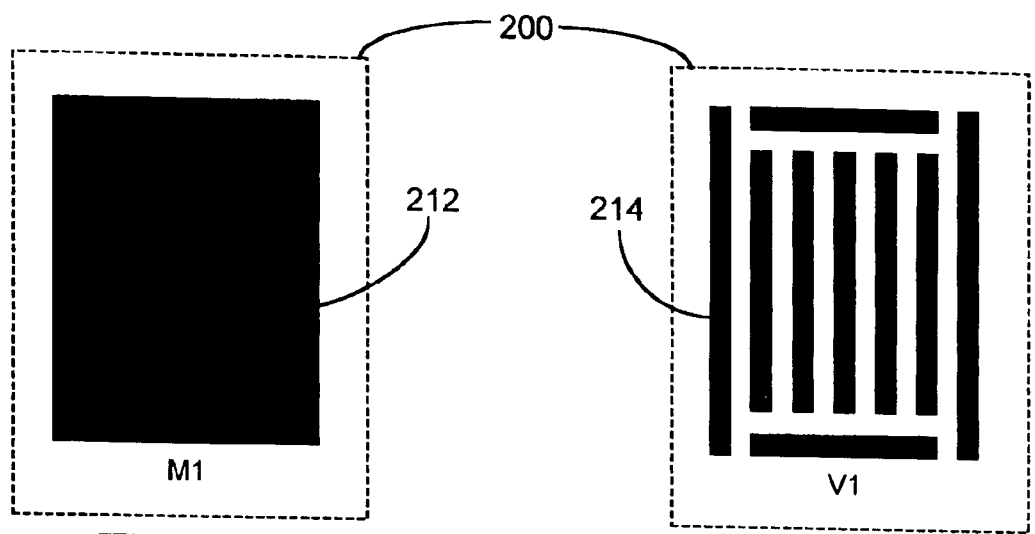
Figure 2D:
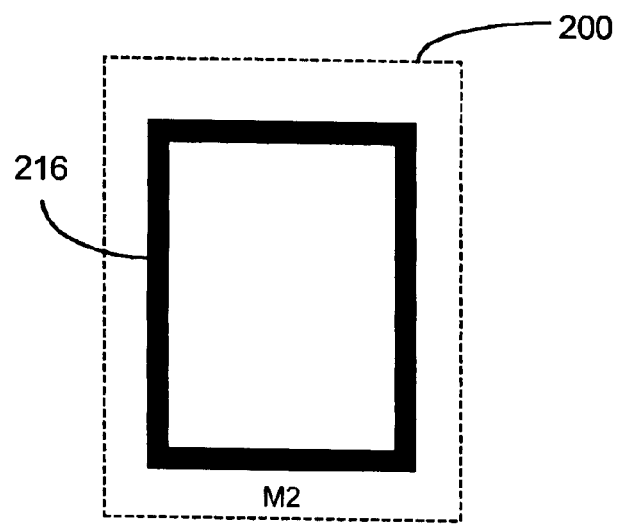
Figure 2G:
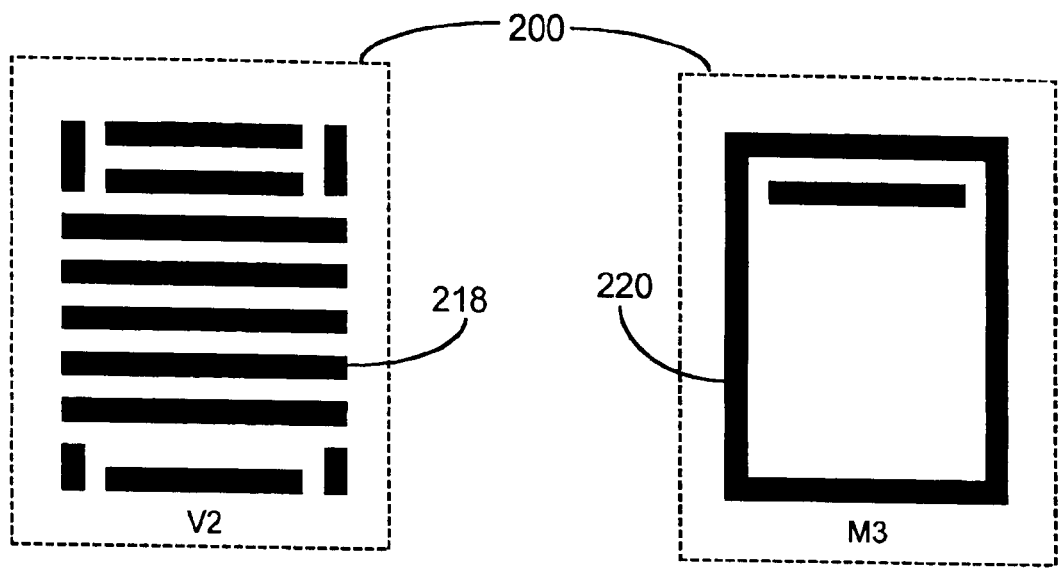
Figure 2G:
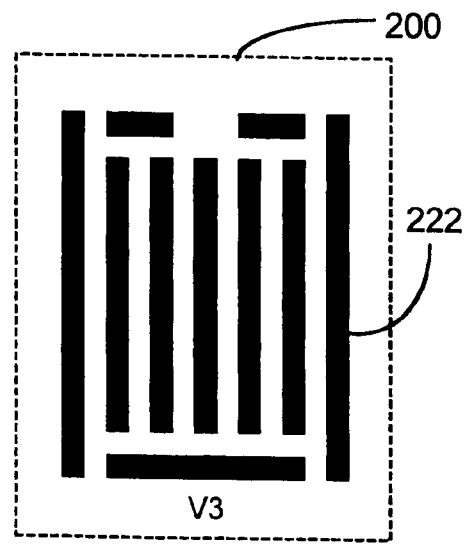

FIGS. 2a–2j are representative of the metal components of one embodiment of an interdigitated capacitor 200 according to the present invention, using a five metal layer process. FIG. 2a is a color drawing representative of a composite plan view of capacitor 200. A color legend to the right of device 200 in FIG. 2a is descriptive of the one or more metal and/or via layers associated with the keyed structure. In the description herein, it is to be understood that there exists an etch stop layer between each successive layer of metal, unless interconnected by an intervening via layer, similar to the composite structure illustrated in FIGS. 1a–1i. Region 201, a capacitor lead, comprises M4 metal layer. Region 202 represents a layering of M1, V1, M2, V2, M3, and M5. Region 203 represents a layering of V2, M3, and M4. In region 204, as well as similarly-keyed regions, the represented layers include V1 and V3. In region 205, as well as similarly-keyed regions, the represented layers include M1, V2, and V4. In region 206, as well as similarly-keyed regions, the represented layers include M1, V1, M2, V2, M3, V3, M4, V4, and M5. In region 207, as well as similarly-keyed regions, the represented layer includes M1 only. In region 208, as well as similarly-keyed regions, the represented layers include M1, V1, M2, M3, V3, M4, and M5. In region 209, as well as similarly-keyed regions, the represented layers include M1 and M5. In region 210, as well as similarly-keyed regions, the represented layers include M1, M2, M3, M4, and M5. Region 211, another capacitor lead includes primarily M5 material. Again, a layer of etch-stop material is desired to be interposed between successive metal layers, for example, M1, ES1, M2, ES3, M3, ES5, M4, ES7, and M5.

In view of the above, FIGS. 2b–2j illustrate the regions of particular metal/via layers which can be stacked vertically to form device 200 in FIG. 2a. As noted above, a layer of etch stop material, such as, for example, SiC, SiN, PSG, and the like, is interposed between adjacent metal layers. In device 200, metal layer M1 is represented by structure 212 in FIG. 2b, via layer V1 is represented by structure 214 in FIG. 2c, metal layer M2 is represented by structure 216 in FIG. 2d, via layer V2 is represented by structure 218 in FIG. 2e, metal layer M3 is represented by structure 220 in FIG. 2f, via layer V3 is represented by structure 222 in FIG. 2g, metal layer M4 is represented by structure 224 in FIG. 2h, via layer V4 is represented by structure 226 in FIG. 2i, and metal layer M5 is represented by structure 228 in FIG. 2j. Returning to FIG. 2a, regions 201 are comprised primarily of metal layer M4 which corresponds to structure 224 in FIG. 2h. Regions 202 are comprised primarily of M1 212, V1 214, M2 216, V2 218, M3 220, and M5 228. Regions 203 are comprised primarily of V2 218, M3 220, and M4 224. Regions 204 are comprised primarily of V1 214 and V3 222. Regions 205 are comprised primarily of M1 212, V2 218, and V4 226. Regions 206 are comprised primarily of M1 212, V1 214, M2 216, V2 218, M3 220, V3 222, M4 224, V4 226, and M5 228. Regions 207 is comprised primarily of M1 212. Regions 208 are comprised primarily of M1 212, V1 214, M2 216, M3 220, V3 222, M4 224, and M5 228. Regions 209 are comprised primarily of M1 212 and M5 228. Regions 210 are comprised primarily of M1 212, M2 216, M3 220, M4 224, and M5 228. Region 211, another capacitor lead is comprised primarily of M5 228 material.

A skilled artisan would realize that interposed between layer M1 212, layer M2 216, layer M3 220, layer M4 224, and layer M5 228 are interposed etch stop layers similar to layers 114, 134, 154, and 164, in FIG. 1i. As noted above, this etch stop material can be, for example, SiC, SiN, PSG, and the like, which generally possesses a higher dielectric constant, k, than adjacent ILD material. Vias selectively penetrate the aforementioned etch stop layers to created predetermined conductive paths within device 200. Via structure V1 214 provides conductive path between metal layer M1 212 and metal layer M2 216 selectively being deposited in patterns etched through the etch stop layer interposed between M1 212 and M2 216. Similarly, via layer V2 218 provides a conductive path between layers M2 216 and M3 220 because of the selective removal of the etch stop layer interposed between layer M2 216 and M3 220. Likewise, via layer V3 222 provides selective conductive paths between metal layer M3 220 and metal layer M4 224 by way of selective removal of the etch stop layer interposed between layer M3 220 and metal layer M4 224. Finally, via layer V4 provides selective conductive paths between metal layer M4 224 and metal layer M5 228 by selective removal of the etch stop layer interposed between metal layer M4 224 and metal layer M5 228.

Figure 3A:
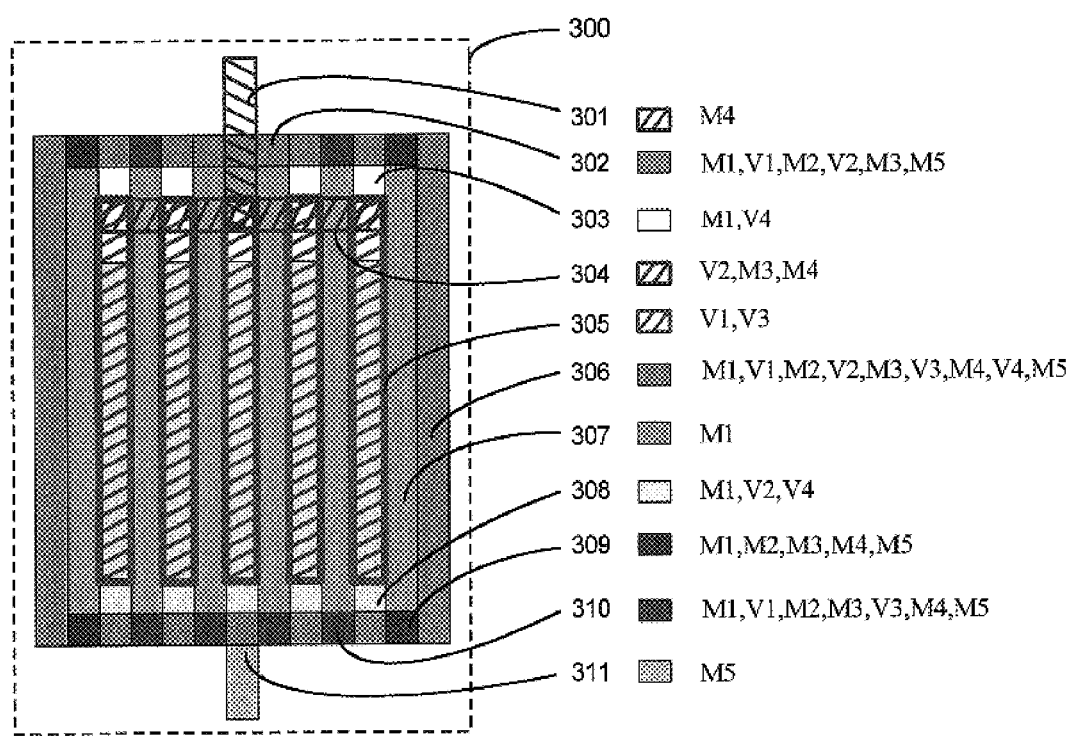
FIG. 3a is a color representation of a composite plan view of a second embodiment of an multi-layer interdigitated MiM capacitor, including a color-coded key describing selected layers of preselected regions.
Figures 3B, 3C:
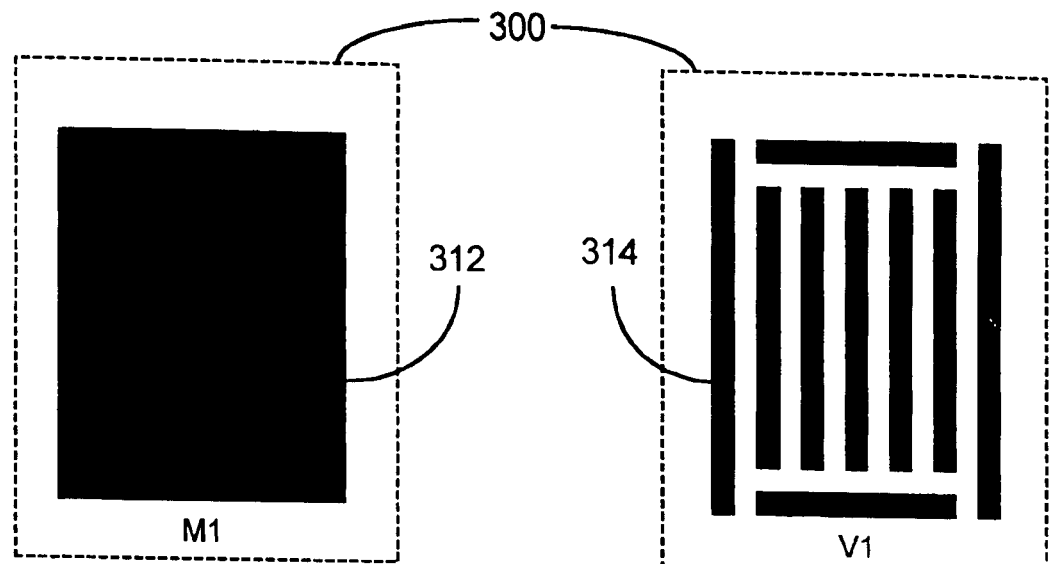
Figure 3D:
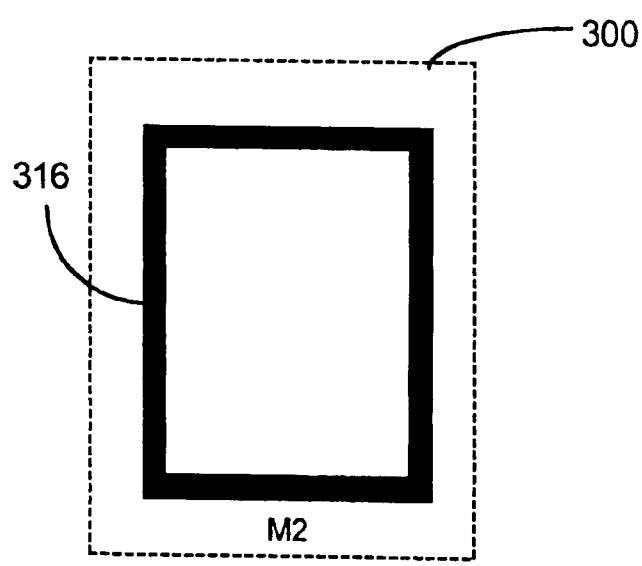
Figures 3E, 3F:
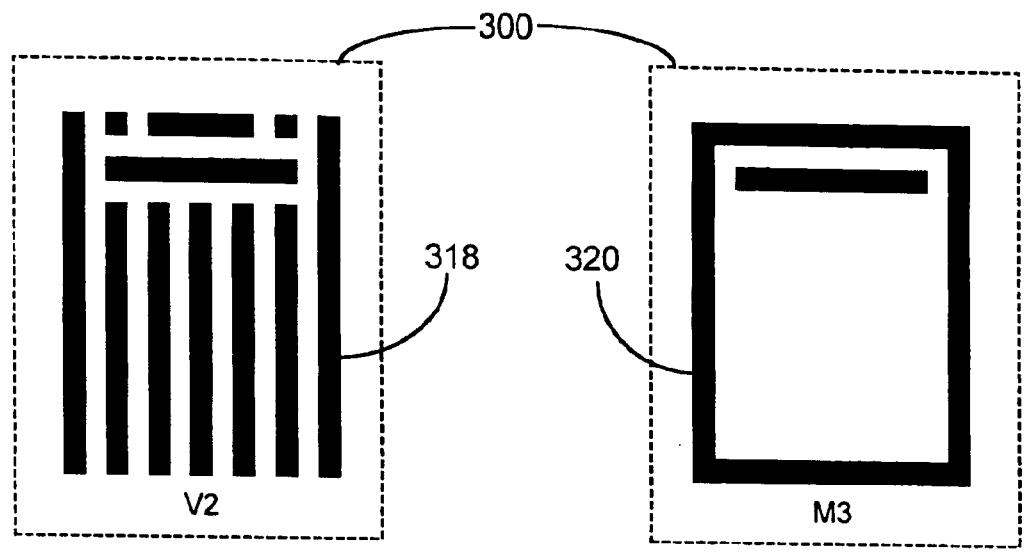
Figure 3G:
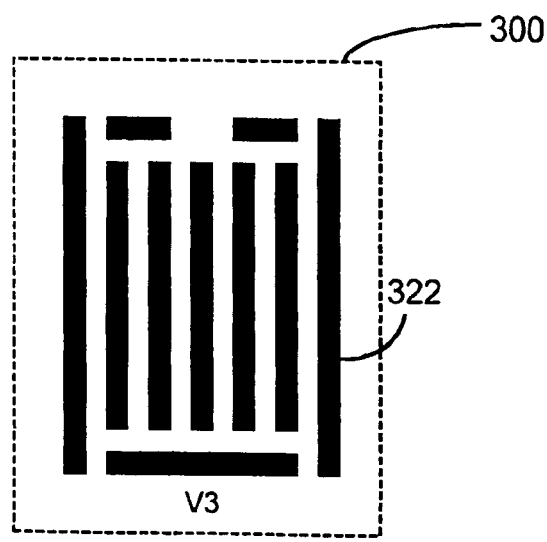

FIGS. 3a–3j are representative of the metal components of another embodiment of an interdigitated capacitor 300 according to the present invention, using a five metal layer process. FIG. 3a is a color drawing representative of a composite plan view of capacitor 300. A color legend to the right of device 300 in FIG. 3a is descriptive of the one or more metal and/or via layers associated with the keyed structure. In the description herein, it is to be understood that there exists an etch stop layer between each successive layer of metal, unless interconnected by an intervening via layer, similar to the composite structure illustrated in FIGS. 1a–1i. Region 301, a capacitor lead, comprises M4 metal layer. Region 302 represents a layering of M1, V1, M2, V2, M3, and M5. In region 303, as well as similarly-keyed regions, the represented layers include M1 and V4. In region 304, as well as similarly-keyed regions, the represented layers include V2, M3, and M4. In region 305, as well as similarly-keyed regions, the represented layers include V1 and V3. In region 306, as well as similarly-keyed regions, the represented layers include M1, V1, M2, V2, M3, V3, M4, V4, and M5. In region 307, as well as similarly-keyed regions, the represented layer includes M1 only. In region 308, as well as similarly-keyed regions, the represented layers include M1, V2, and V4. In region 309, as well as similarly-keyed regions, the represented layers include M1, M2, M3, M4, and M5. In region 310, as well as similarly-keyed regions, the represented layers include M1, V1, M2, M3, V3, M4, and M5. Region 311, another capacitor lead, includes primarily M5 material.

In view of the above, FIGS. 3b–3j illustrate the regions of the particular metal/via layers which can be stacked vertically to form device 300 in FIG. 3a. In device 300, metal layer M1 is represented by structure 312 in FIG. 3b, via layer V1 is represented by structure 314 in FIG. 3c, metal layer M2 is represented by structure 316 in FIG. 3d, via layer V2 is represented by structure 318 in FIG. 3e, metal layer M3 is represented by structure 320 in FIG. 3f, via layer V3 is represented by structure 322 in FIG. 3g, metal layer M4 is represented by structure 324 in FIG. 3h, via layer V4 is represented by structure 326 in FIG. 3i, and metal layer M5 is represented by structure 328 in FIG. 3j. Returning to FIG. 3a, regions 301 are comprised primarily of metal layer M4, which corresponds to structure 324 in FIG. 3h. Regions 302 are comprised primarily of M1 312, V1 314, M2 316, V2 318, M3 320, and M5 328. Regions 303 are comprised primarily of M1 312 and V4 326. Region 304 are comprised primarily of V2 318, M3 320, and M4 324. Regions 305 include primarily V1 314, and V3 322. Regions 306 are comprised primarily of M1 312, V1 314, M2 316, V2 318, M3 320, V3 322, M4 324, V4 326 and M5 328. Regions 307 are comprised primarily of M1 312. Regions 308 are comprised primarily of M1 312, V2 318, and V4 326. Regions 309 are comprised primarily of M1 312, M2 316, M3 320, M4 324, and M5 328. Regions 310 are composed primarily of M1 312, V1 314, M2 316, M3 320, V3 322, M4 324, and M5 328. Region 311 is composed primarily M5 328.

A skilled artisan would realize that interposed between layer M1 312, layer M2 316, layer M3 320, layer M4 324, and layer M5 328 are interposed etch stop layers similar to layers 114, 134, 154, and 164, in FIG. 1i. As noted above, this etch stop material can be, for example, SiC, SiN, PSG, and the like, which generally possesses a higher dielectric constant, k, than adjacent ILD material. Vias selectively penetrate the aforementioned etch stop layers to create predetermined conductive paths within device 300. For example, via structure V1 314 provides conductive path between metal layer M1 312 and metal layer M2 316 selectively being deposited in patterns etched through the etch stop layer interposed between M1 312 and M2 316. Similarly, via layer V2 318 provides a conductive path between layers M2 316 and M3 320 because of the selective removal of the etch stop layer interposed between layer M2 316 and M3 320. Likewise, via layer V3 322 provides selective conductive paths between metal layer M3 320 and metal layer M4 324 by way of selective removal of the etch stop layer interposed between layer M3 320 and metal layer M4 324. Finally, via layer V4 provides selective conductive paths between metal layer M4 324 and metal layer M5 328 by selective removal of the etch stop layer interposed between metal layer M4 324 and metal layer M5 328.

Figure 4A:
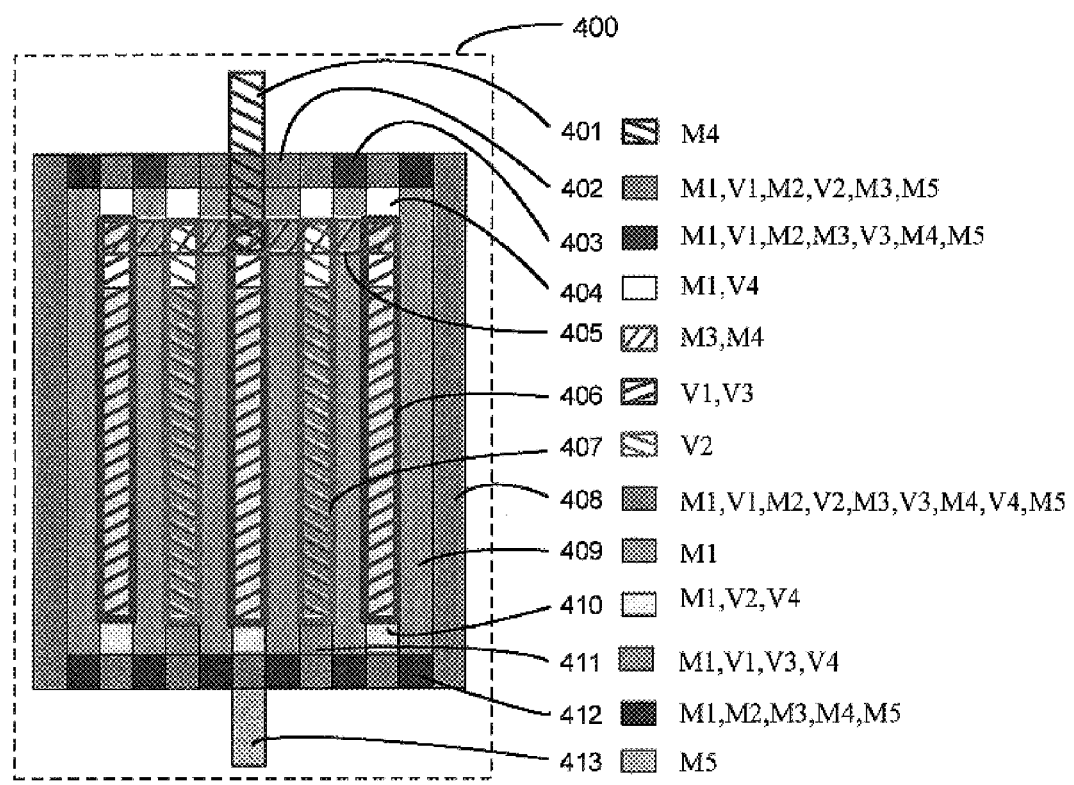
FIG. 4a is a color representation of a composite plan view of a third embodiment of an multi-layer interdigitated MiM capacitor, including a color-coded key describing selected layers of preselected regions.
Figure 4D:
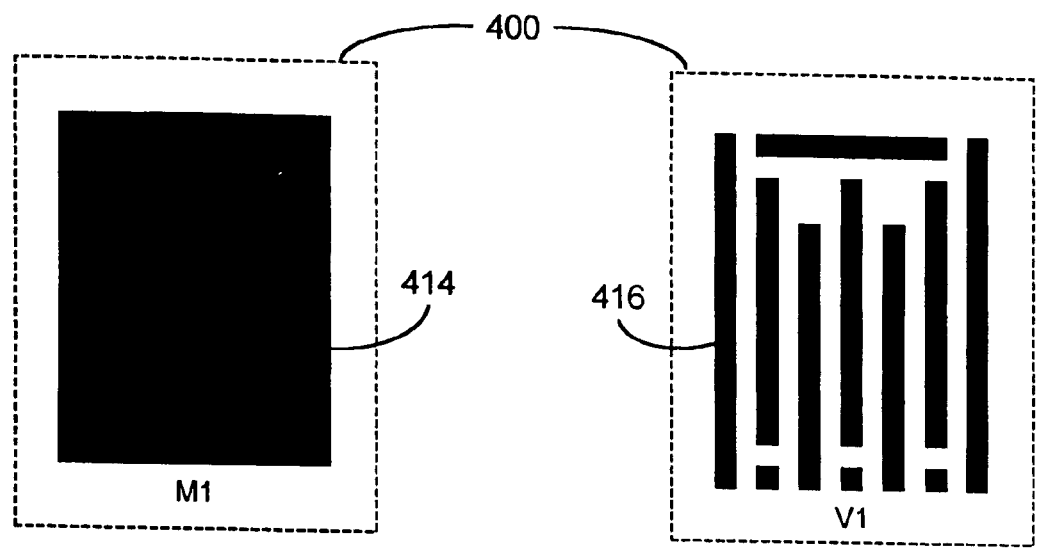
Figure 4D:
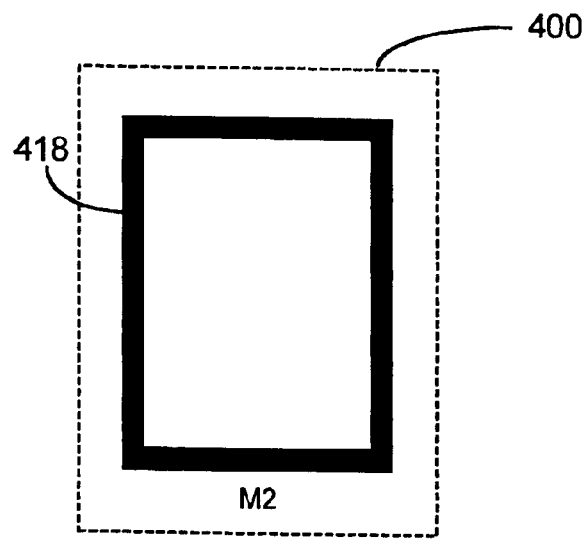
Figures 4E, 4F:
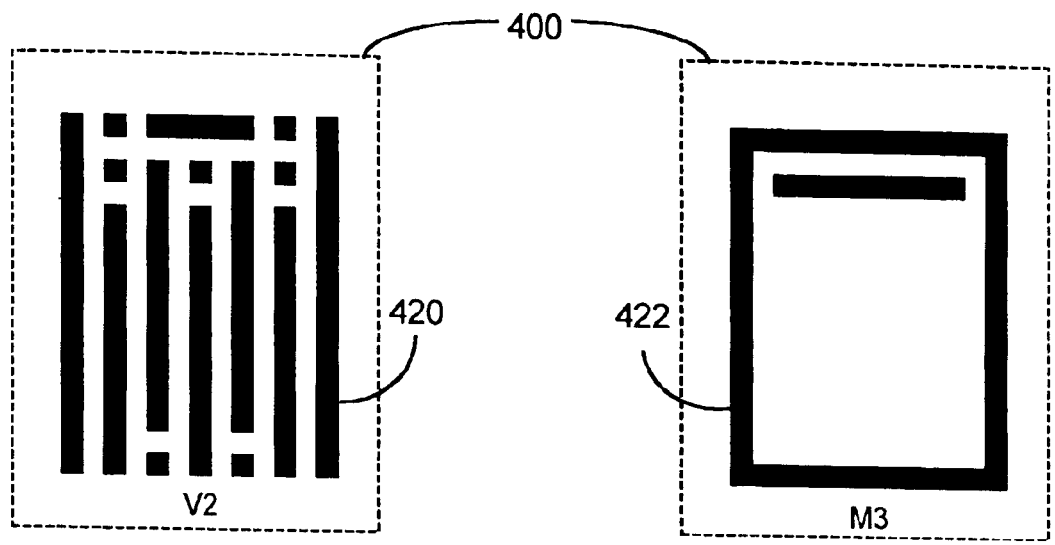
Figure 4G:
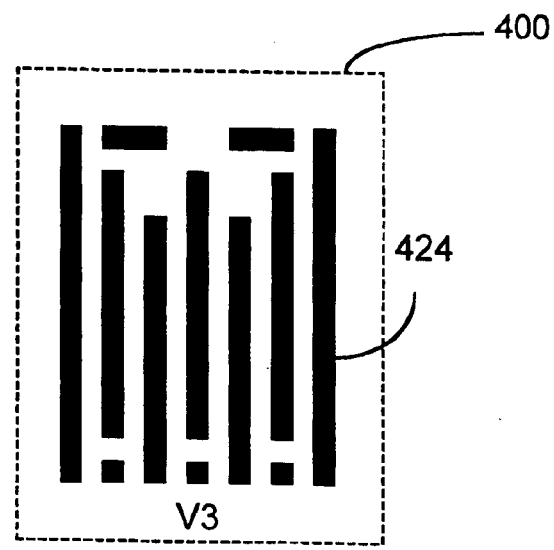

FIGS. 4a–4j are representative of the metal components of yet another embodiment of a multi-layer interdigitated capacitor 400 according to the present invention, using a five metal layer process. FIG. 4a is a color drawing representative of a composite plan view of capacitor 400. A color legend to the right of device 400 in FIG. 4a is descriptive of the one or more metal and/or via layers associated with the keyed structure. In the description herein, it is to be understood that there exists an etch stop layer between each successive layer of metal, unless interconnected by an intervening via layer, similar to the composite structure illustrated in FIGS. 1a–1i. Region 401, a capacitor lead, comprises M4 metal layer. Region 402, as well as similarly-keyed regions, represent a layering of M1, V1, M2, V2, M3, and M5. In region 403, as well as similarly-keyed regions, the represented layers include M1, V1, M2, M3, V3, M4 and M5. In region 404, as well as similarly-keyed regions, the represented layers include M1 and V4. In region 405, as well as similarly-keyed regions, the represented layers include M3 and M4. In region 406, as well as similarly-keyed regions, the represented layers include V1 and V3. In region 407, as well as similarly-keyed regions, the represented layer includes V2 only. In region 408, as well as similarly-keyed regions, the represented layers include M1, V1, M2, V2, M3, V3, M4, V4, and M5. In region 409, as well as similarly-keyed regions, the represented layers include M1. In region 410, as well as similarly-keyed regions, the represented layers include M1, V2, and V4. In region 411, as well as similarly-keyed regions, the represented layers include M1, V1, V3, and V4. In region 412, as well as similarly-keyed regions, the represented layers include M1, M2, M3, M4, and M5. Region 413, another capacitor lead, includes primarily M5 material.

In view of the above, FIGS. 4b–4j illustrate the regions of the particular metal/via layers which can be stacked vertically to form device 400 in FIG. 4a. In device 400, metal layer M1 is represented by structure 412 in FIG. 4b, via layer V1 is represented by structure 414 in FIG. 4c, metal layer M2 is represented by structure 416 in FIG. 4d, via layer V2 is represented by structure 418 in FIG. 4e, metal layer M3 is represented by structure 420 in FIG. 4f, via layer V3 is represented by structure 422 in FIG. 4g, metal layer M4 is represented by structure 424 in FIG. 4h, via layer V4 is represented by structure 426 in FIG. 4i, and metal layer M5 is represented by structure 428 in FIG. 4j. Returning to FIG. 4a, region 401 is comprised primarily of metal layer M4, which corresponds to structure 324 in FIG. 3h. Regions 402 are comprised primarily of M1 412, V1 414, M2 416, V2 418, M3 420, and M5 328. Regions 403 are comprised primarily of M1 412, V1 414, M2 416, M3 420, V3 422, M4 424 and M5 428. Regions 404 are comprised primarily of M1 412 and V4 426. Regions 405 include primarily M3 420, and M4 424. Regions 406 are comprised primarily of V1 414, and V3 422. Regions 407 are comprised primarily of V2 418. Regions 408 are comprised primarily of M1 412, V1 414, M2 416, V2 418, M3 420, V3 422, M4 424, V4 426 and M5 428. Regions 409 is comprised primarily of M1 412. Regions 410 are comprised primarily of M1 412, V2 418, and V4 426. Regions 411 are comprised primarily of M1 412, V1 414, V3 422, and V4 426. Regions 412 are comprised primarily of M1 412, M2 416, M3 420, M4 424, and M5 428. Region 413 is composed primarily M5 428.

A skilled artisan would realize that between layer M1 412, layer M2 416, layer M3 420, layer M4 424, and layer M5 428 are interposed etch stop layers similar to layers 114, 134, 154, and 164, in FIG. 1i. As noted above, this etch stop material can be, for example, SiC, SiN, PSG, and the like, which generally possesses a higher dielectric constant, k, than adjacent ILD material. Vias selectively penetrate the aforementioned etch stop layers to create predetermined conductive paths within device 400. For example, via structure V1 414 provides conductive path between metal layer M1 412 and metal layer M2 416 selectively being deposited in patterns etched through the etch stop layer interposed between M1 412 and M2 416. Similarly, via layer V2 418 provides a conductive path between layers M2 416 and M3 420 because of the selective removal of the etch stop layer interposed between layer M2 416 and M3 420. Likewise, via layer V3 422 provides selective conductive paths between metal layer M3 420 and metal layer M4 424 by way of selective removal of the etch stop layer interposed between layer M3 420 and metal layer M4 424. Finally, via layer V4 426 provides selective conductive paths between metal layer M4 424 and metal layer M5 428 by selective removal of the etch stop layer interposed between metal layer M4 424 and metal layer M5 428.

Figure 5A:
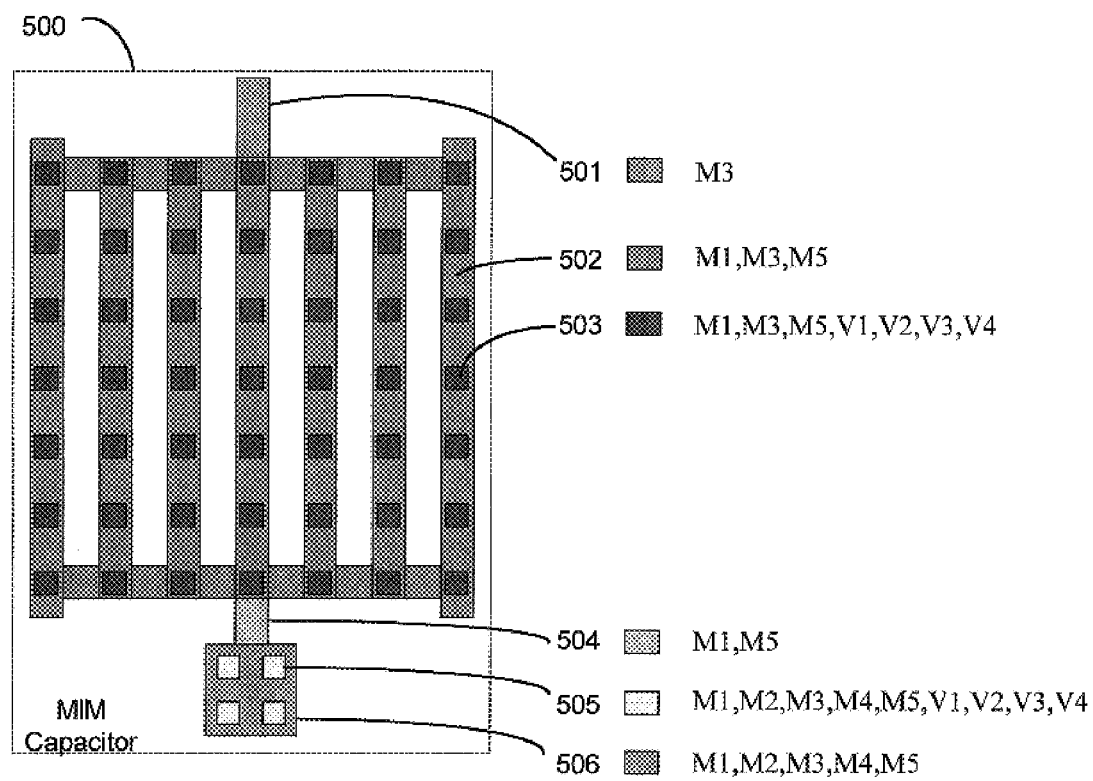
FIG. 5a is a color representation of a composite plan view of an multi-layer grid array MiM capacitor, including a color-coded key describing selected layers of preselected regions.
Figures 5B, 5C:
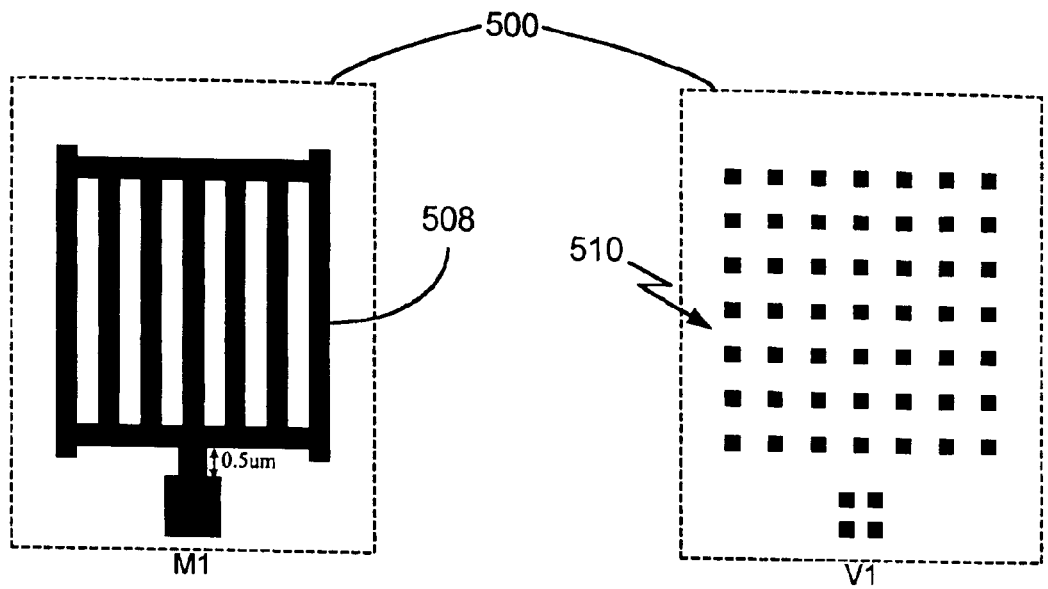
Figure 5D:
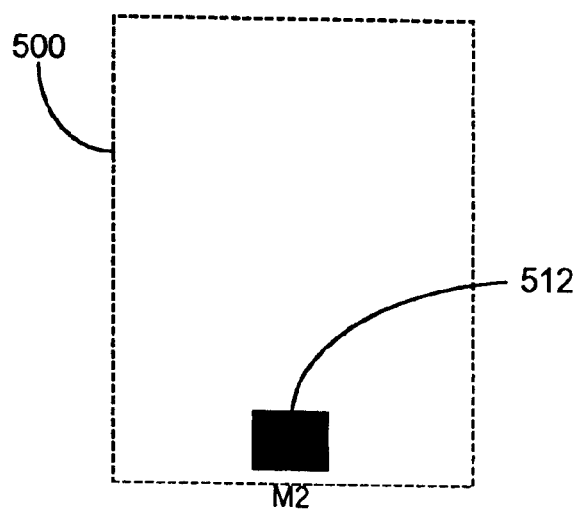
Figure 5G:
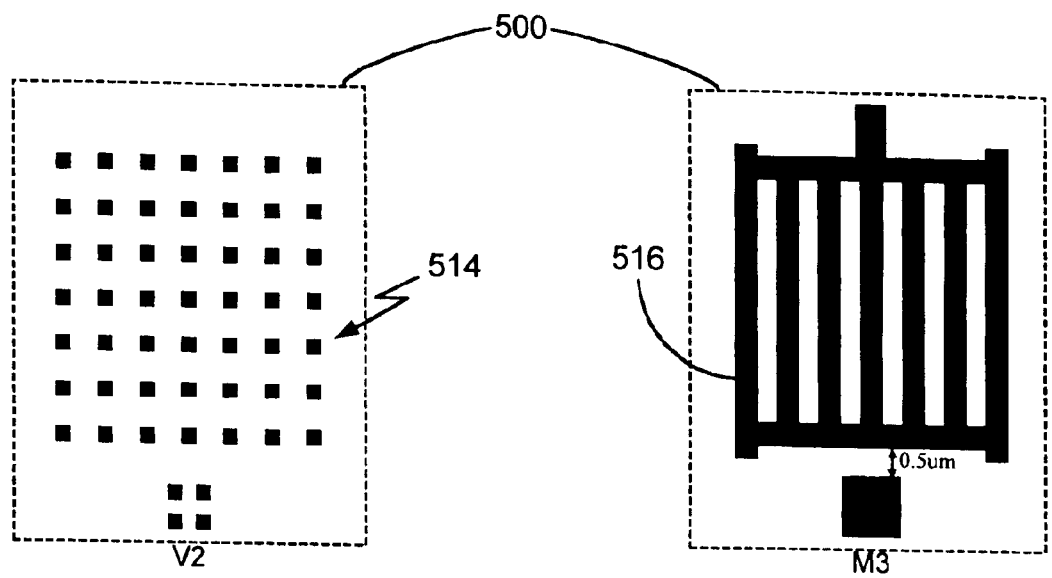
Figure 5G:
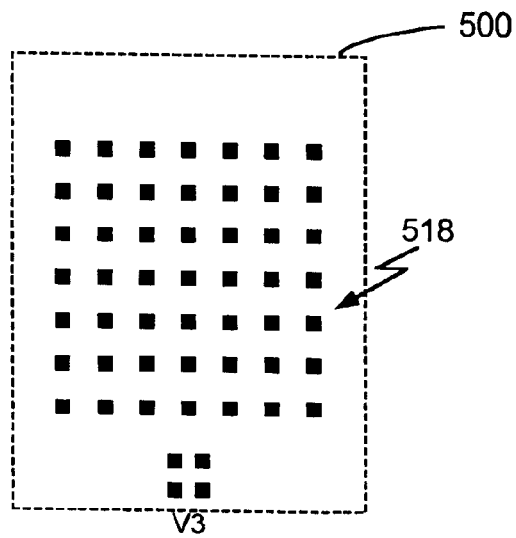

FIGS. 5a–5j are representative of the metal components of one embodiment of a multi-layer 3-dimensional array capacitor 500 according to the present invention, using a five metal layer process. FIG. 5a is a color drawing representative of a composite plan view of capacitor 500. A color legend to the right of device 500 in FIG. 5a is descriptive of the one or more metal and/or via layers associated with the keyed structure. In the description herein, it is to be understood that there exists an etch stop layer between each successive layer of metal, unless interconnected by an intervening via layer, similar to the composite structure illustrated in FIGS. 1a–1i. Region 501, a capacitor lead, comprises M3 metal layer. Region 502 represents a layering of M1, M3, and M5. In region 503, as well as similarly-keyed regions, the represented layers include M1, V1, V2, M3, V3, V4 and M5. In region 504, as well as similarly-keyed regions, the represented layers include M1 and M5. In region 505, as well as similarly-keyed regions, the represented layers include M1, V1, M2, V2, M3, V3, M4, V4, and M5. In region 506, as well as similarly-keyed regions, the represented layers include M1, M2, M3, M4, and M5.

In view of the above, FIGS. 5b–5j illustrate the regions of the particular metal/via layers which can be stacked vertically to form device 500 in FIG. 5a. In device 500, metal layer M1 is represented by structure 512 in FIG. 5b, via layer V1 is represented by structure 514 in FIG. 5c, metal layer M2 is represented by structure 516 in FIG. 5d, via layer V2 is represented by structure 518 in FIG. 5e, metal layer M3 is represented by structure 520 in FIG. 5f, via layer V3 is represented by structure 522 in FIG. 5g, metal layer M4 is represented by structure 524 in FIG. 5h, via layer V4 is represented by structure 526 in FIG. 5i, and metal layer M5 is represented by structure 528 in FIG. 5j. Returning to FIG. 5a, regions 501 are comprised primarily of metal layer M3, which corresponds to structure 520 in FIG. 5f. Regions 502 are comprised primarily of M1 512, M3 520, and M5 528. Regions 503 are comprised primarily of M1 512, V1 514, V2, 518, M3 520, V3 522, V4 526, and M5 528. Region 504 are comprised primarily of M1 512 and M5 528. Regions 505 are comprised primarily of M1 512, V1 514, M2 516, V2 518, M3 520, V3 522, M4 524, V4 526 and M5 528. Regions 506 comprised primarily of M1 512, M2 516, M3 520, M4 524, and M5 528.

A skilled artisan would realize that interposed between layer M1 512, layer M2 516, layer M3 520, layer M4 524, and layer M5 528 are interposed etch stop layers similar to layers 114, 134, 154, and 164, in FIG. 1i. As noted above, this etch stop material can be, for example, SiC, SiN, PSG, and the like, which generally possesses a higher dielectric constant, k, than adjacent ILD material. Vias selectively penetrate the aforementioned etch stop layers to create predetermined conductive paths within device 500. For example, via structure V1 314 provides conductive path between metal layer M1 312 and metal layer M2 316 selectively being deposited in patterns etched through the etch stop layer interposed between M1 312 and M2 316. Similarly, via layer V2 318 provides a conductive path between layers M2 316 and M3 320 because of the selective removal of the etch stop layer interposed between layer M2 316 and M3 320. Likewise, via layer V3 322 provides selective conductive paths between metal layer M3 320 and metal layer M4 324 by way of selective removal of the etch stop layer interposed between layer M3 320 and metal layer M4 324. Finally, via layer V4 provides selective conductive paths between metal layer M4 324 and metal layer M5 328 by selective removal of the etch stop layer interposed between metal layer M4 324 and metal layer M5 328.

Obviously, numerous modifications and variations of the present invention are possible in light of the above teachings. It is therefore to be understood that within the scope of the appended claims, the invention may be practiced otherwise than as specifically described herein.

What is claimed:

1. A method of forming a metal-insulator-metal capacitor on a substrate comprising:

defining a first portion of one or more layers formed on the substrate;

forming a first well in the first portion;

applying a first diffusion barrier metal layer on the first well;

forming a first conductive plug in the first well;

forming an etch-stop layer on at least a portion of the first conductive plug, the etch-stop layer having a preselected dielectric constant and a predetermined geometry;

defining a second portion of the one or more layers adjacent the etch-stop layer;

forming a second well in the second portion to expose at least a portion of the etch-stop layer, applying a second diffusion barrier metal layer on the second well and on an exposed portion of the etch-stop layer; and forming a second conductive plug in the second well to provide the metal-insulator-metal capacitor with the first conductive plug through the etch-stop layer.

2. The method of claim 1, wherein the preselected dielectric constant is above about 4.0.

3. The method of claim 1, wherein the etch-stop layer comprises a silicon nitride having a preselected dielectric constant of between about 5.5 and about 9.0.

4. The method of claim 1, wherein at least one of the first conductive plug and the second conductive plug is a metal.

5. The method of claim 1, further comprising varying the spatial relationship between the first conductive plug and the second conductive plug to vary the capacitance of the metal-insulator-metal capacitor.

* * * * *